United States Patent
Ochi et al.

(10) Patent No.: US 8,035,383 B2
(45) Date of Patent: Oct. 11, 2011

(54) MAGNETIC RESONANCE IMAGING APPARATUS AND RF COIL FOR MAGNETIC RESONANCE IMAGING APPARATUS

(75) Inventors: Hisaaki Ochi, Kodaira (JP); Masayoshi Dohata, Yokohama (JP); Atsushi Ninomiya, Ome (JP); Yoshiyuki Miyamoto, Abiko (JP)

(73) Assignees: Hitachi, Ltd., Tokyo (JP); Hitachi Medical Corporation, Tokyo (JP)

( * ) Notice: Subject to any disclaimer, the term of this patent is extended or adjusted under 35 U.S.C. 154(b) by 276 days.

(21) Appl. No.: 12/064,514

(22) PCT Filed: Dec. 21, 2006

(86) PCT No.: PCT/JP2006/325507
§ 371 (c)(1),
(2), (4) Date: Aug. 6, 2009

(87) PCT Pub. No.: WO2007/108190
PCT Pub. Date: Sep. 27, 2007

(65) Prior Publication Data
US 2010/0033183 A1    Feb. 11, 2010

(30) Foreign Application Priority Data
Mar. 17, 2006   (JP) ................... 2006-074895

(51) Int. Cl.
*G01V 3/00* (2006.01)
(52) U.S. Cl. ...................... 324/318; 324/322
(58) Field of Classification Search .......... 324/300–322; 600/407–445
See application file for complete search history.

(56) References Cited

U.S. PATENT DOCUMENTS

| 5,107,216 A | * | 4/1992 | Yabusaki et al. ............... 324/318 |
| 5,109,198 A | * | 4/1992 | Murakami et al. ............. 324/318 |
| 5,293,519 A | | 3/1994 | Yoshino et al. |

(Continued)

FOREIGN PATENT DOCUMENTS

JP   04-054939   2/1992
(Continued)

OTHER PUBLICATIONS

S. Su, et al., "A Noel 15-Element SENSE-Compatible Vertical Field PV Array Coil", Proc. Intl. Mag. Reson. Med. 12, 2386, (2004).
L. Feng, et al., "The SENSE Cardia Coil for 4-channel Vertical Field MRI Systems", Proc. Intl. Mag. Reson. Med. 12, 1600, (2004).
J.B. Ra, C.Y. Rim: "Fast Imaging Using Subencoding Data Sets from Multiple Detectors," Magnetic Resonance in Medicine, vol. 30, pp. 142-145 (1993).

*Primary Examiner* — Brij Shrivastav
(74) *Attorney, Agent, or Firm* — Antonelli, Terry, Stout & Kraus, LLP.

(57) ABSTRACT

This invention provides a receiving coil that allows a high-quality image of high depth sensitivity to be obtained during vertical magnetic field MRI without limiting selection of a cross section to be imaged and of a phase-encoding axis. A subject's field of view is broadened without deterioration of the coil characteristics. Two orthogonal solenoid coils (3-1 and 4-1) and sub-coils (5-1, 6-1, and 7-1) whose sensitivity distributions each become an odd function in an x-direction, a y-direction, and a z-direction, respectively, with respect to the origin of the sensitivity distribution of each of the solenoid coils are used as multiple sub-coils to construct the receiving coil. This receiving coil is suitable for a high-speed imaging method in which an image is acquired using reduced phase encoding and the image is reconstructed using image folding. In addition, the subject's field of view can be broadened by arranging conductors of the coil appropriately.

22 Claims, 25 Drawing Sheets

U.S. PATENT DOCUMENTS

| | | |
|---|---|---|
| 7,061,242 B2 | 6/2006 | Ochi et al. |
| 7,176,688 B2 * | 2/2007 | Sato .............................. 324/318 |
| 7,808,241 B2 * | 10/2010 | Dohata et al. ................ 324/318 |
| 7,868,614 B2 * | 1/2011 | Bito et al. ..................... 324/307 |
| 7,898,255 B2 * | 3/2011 | Ochi et al. .................... 324/318 |
| 2002/0013526 A1 | 1/2002 | Su et al. |
| 2004/0061498 A1 | 4/2004 | Ochi et al. |
| 2009/0251145 A1 * | 10/2009 | Kaneko et al. ................ 324/318 |
| 2010/0033177 A1 * | 2/2010 | Ochi et al. .................... 324/307 |
| 2011/0031970 A1 * | 2/2011 | Ninomiya et al. ............ 324/309 |

FOREIGN PATENT DOCUMENTS

| | | |
|---|---|---|
| JP | 2001-137215 | 5/2001 |
| JP | 2002-153440 | 5/2002 |
| JP | 2003-079595 | 3/2003 |
| JP | 2004-154301 | 6/2004 |

* cited by examiner

MAGNETIC RESONANCE IMAGING APPARATUS AND RF COIL FOR MAGNETIC RESONANCE IMAGING APPARATUS

TECHNICAL FIELD

The present invention relates to magnetic resonance imaging apparatus (hereinafter, referred to as MRI apparatus) and more particularly to a radio-frequency (RF) receiving coil for detecting nuclear magnetic resonance signals.

BACKGROUND ART

In magnetic resonance imaging (MRI), the echo signals required for imaging apparatus construction are acquired by repeatedly executing an imaging sequence while varying a phase-encoding level, that is, the strength of a gradient magnetic field for phase encoding. Accordingly, an imaging time depends on the quantity of phase encoding and on a repetition time, and reduction of the imaging time is therefore desired.

A technique, termed "parallel imaging," that uses multiple RF coils and image folding has started to be put into practical use as a technique for reducing the imaging time (hereinafter, this technique is called parallel imaging) [refer to Non-Patent Document 1].

To implement parallel imaging, it is necessary first to suppress mutual electromagnetic coupling between multiple sub-coils sufficiently. Electromagnetic coupling between the sub-coils causes noise interference to occur therebetween and deteriorates the S/N ratios of images. There is a need next to arrange the multiple sub-coils appropriately. Inappropriate arrangement of the sub-coils partly deteriorates the S/N ratios of the images. Among the criteria for evaluating the adequacy of the sub-coil arrangement is a criterion called the geometry factor (hereinafter, abbreviated to the G-factor). The G-factor is a value derived from the sensitivity distribution of each sub-coil in an imaging plane, and it is desired that the G-factor of an image section at which an object to be imaged is present should be as small as possible.

Parallel imaging is developed primarily on a horizontal magnetic field machine in high magnetic field strength, and various kinds of receiving coils adapted for horizontal magnetic field machines have been proposed. Arrangement forms of receiving coils adapted for vertical magnetic fields are proposed in Patent Documents 1 and 2. Vertical magnetic field MRI have the advantage that they allow the use of solenoid coils highly sensitive to depths of a subject, compared with horizontal magnetic field MRI. A solenoid coil, a two-turn solenoid coil (saddle coil) with sensitivity in a direction orthogonal to the former solenoid coil, and three sets of surface coils having sensitivity in x-, y-, and z-directions, respectively, are used in combination as coils highly sensitive to the depths of the subject, and these coils form the receiving coil of the vertical magnetic field MR imaging apparatus proposed in Patent Document 2. The use of these coils makes any phase-encoding direction selectable.

Non-Patent Document 1: J. B. Ra, C. Y. Rim: "Fast Imaging Using Subencoding Data Sets from Multiple Detectors," Magnetic Resonance in Medicine, vol. 30, pp. 142-145 (1993)

Patent Document 1: JP-A-2002-153440

Patent Document 2: JP-A-2003-79595

DISCLOSURE OF THE INVENTION

Problems to be Solved by the Invention

The receiving coil described in Patent Document 2 uses surface coils. In general, two surface coils arranged facing each other are great in the degree of electromagnetic coupling. If the distance between the two coils is, in some degree, greater than the sizes of the coils, electromagnetic coupling between the coils can be reduced to a practically negligible level by adopting a known electromagnetic coupling suppression method (e.g., suppressing electromagnetic coupling by inserting a low-input-impedance amplifier into a signal detection circuit). If the sizes of the surface coils are greater than the inter-coil distance, however, this leaves the problem that electromagnetic coupling is insuppressible with the above-mentioned electromagnetic coupling suppression method only. If the sizes of the surface coils are greater, the degree of electromagnetic coupling between the surface coils and the solenoid coil having sensitivity in the same direction as that of the surface coils is also high, which leaves the problem that electromagnetic coupling is insuppressible with the above-mentioned electromagnetic coupling suppression method only. Reducing the sizes of the surface coils to such an extent that the degree of electromagnetic coupling to the solenoid coil can be ignored does not improve the G-factor at the depths of the subject. Connecting an auxiliary coil in series to each of the two coils to be reduced in the degree of coupling and then magnetically coupling the two auxiliary coils to each other allows removal of inter-coil inductive decoupling but is likely to reduce the sensitivity of the coils. In addition, for reduced manufacturing costs of the imaging apparatus, it is desirable that the number of coils be as small as possible.

The receiving coil, especially, a receiving coil formed by combining multiple coils to image the head takes a complex coil configuration with a large number of coil conductors crossing one another. Therefore, the number of conductors covering a human subject's head increases, making it difficult for the subject to obtain a field of view. A technique for broadening the subject's field of view and reducing his or her metal oppression is disclosed in Patent Document 3. Applying a light-transmissive material to a cover formed to protect the coil conductors and applying an electroconductive material having a light-transmitting property to the conductors are proposed in Patent Document 3.

However, since electroconductive materials with a light-transmitting property are generally inferior to copper and other metallic conductors in electroconductivity, the application of an electroconductive material having a light-transmitting property is required to be further limited when the receiving coil formed by combining multiple coils is designed.

Patent Document 3: Japanese Laid-Open Patent Application Publication No. 2004-154301

An object of the present invention is to provide a receiving coil excellent in mountability in a vertical-magnetic-field-type magnetic resonance imaging apparatus and effective for obtaining high image quality in diverse imaging methods including parallel imaging or the like and a magnetic resonance imaging apparatus with such a receiving coil. More specifically, the invention is intended to provide a receiving coil in which the foregoing problems associated with magnetic coupling are basically solved and which includes a plurality of coils each having a small G-factor and a magnetic resonance imaging apparatus with such a receiving coil. Another object of the present invention is to provide a receiving coil that makes an arbitrary phase-encoding direction selectable and a magnetic resonance imaging apparatus with such a receiving coil. More particularly, the invention is intended to provide a receiving coil adapted so that when the coil is used for imaging the head, a field of view of a human subject can be obtained in a necessary and sufficient range without deteriorating characteristics of the coil and a magnetic resonance imaging apparatus with such a receiving coil.

Means for Solving the Problems

The present invention provides a magnetic resonance imaging apparatus (MRI apparatus) that comprises means for generating a static magnetic field in a vertical direction, means for generating an excitation RF pulse to be applied to an object placed in the static magnetic field for examination, means for generating a gradient magnetic field, and a receiving coil constructed of a plurality of sub-coils and for detecting a nuclear magnetic resonance signal generated from the object to be examined; wherein the receiving coil includes, as the plurality of sub-coils, a first sub-coil formed of one or multiple solenoid coils to detect a magnetic field generated in a crossing direction with respect to the direction of the static magnetic field and a second sub-coil whose sensitivity distribution becomes an odd function in the direction of the static magnetic field with a central axis of any one of the solenoid coils as an origin of the sensitivity distribution.

For this MR imaging apparatus, a receiving coil substantially free of inter-coil magnetic coupling can be constructed by combining sub-coils whose sensitivity distributions become an odd function with respect to the central axis of a solenoid coil. In addition, since inter-coil magnetic coupling does not occur, an area of the second sub-coil can be increased, and a G-factor improved.

In the MR imaging apparatus of the present invention, the second sub-coil, for example, has four current loops, which are arranged so as to surround the object to be examined. In addition, the first sub-coil is formed up of a first solenoid coil and a second solenoid coil, and the first and second solenoid coils have respective loops arranged substantially orthogonal to each other.

The receiving coil in the MR imaging apparatus of the present invention can also include a third sub-coil and a fourth sub-coil, a sensitivity distribution of each becoming an odd function in a direction orthogonal to the direction of the static magnetic field.

The present invention provides another magnetic resonance imaging apparatus (MRI) that comprises means for generating a static magnetic field in a vertical direction, means for generating an excitation RF pulse to be applied to an object placed in the static magnetic field for examination, means for generating a gradient magnetic field, and a receiving coil constructed of a plurality of sub-coils and for detecting a nuclear magnetic resonance signal generated from the object to be examined; wherein the receiving coil includes, as the plurality of sub-coils, a first sub-coil having a plurality of current loops and formed of a solenoid coil to detect a magnetic field generated in a crossing direction with respect to the direction of the static magnetic field and a second sub-coil with a plurality of current loops and whose sensitivity distribution becomes an odd function in the direction of the static magnetic field with a central axis of either solenoid coil as an origin of the sensitivity distribution, and wherein the first sub-coil and the second sub-coil each have a conductor region passing through a plane essentially parallel to a first plane of the object to be examined, the conductor regions themselves of the first and second sub-coils also being parallel to each other, and both conductor regions being arranged to overlap each other at a position in a distance direction between the coil and the object to be examined.

This MR imaging apparatus causes substantially no magnetic coupling and improves the G-factor. In addition, the number of coil conductors arranged in such a form as to shroud a required plane of the examination object, for example, a person's face, is minimized to obtain a broader field of view.

The conductor region of the first sub-coil in the MR imaging apparatus of the present invention is appropriately disposed in closer proximity to the examination object than the conductor region of the second sub-coil. Peak sensitivity of the first sub-coil formed of a solenoid coil increases with decreases in the coil size, whereas peak sensitivity of the second sub-coil whose sensitivity distribution becomes an odd function does not always depend upon the coil size. The disposition described above, therefore, provides high peak sensitivity to both sub-coils.

At least a part of the conductor regions of the first and second sub-coils in the MR imaging apparatus of the present invention is a plate-shaped conductor, and a plane that the plate-shaped conductor forms is substantially parallel to the direction of the static magnetic field.

This ensures a broader field of view.

In addition, at least a part of the conductor regions of the first and second sub-coils in the MR imaging apparatus of the present invention is formed of a light-transmissive electroconductive material and coverable with a light-transmissive resin. In this case, the portion covered with the light-transmissive resin is preferably formed so that, on a plane including a central axis of a solenoid coil and parallel to the direction of the static magnetic field, when a line parallel to the direction of the static magnetic field that extends toward an upper area above the person's face from a substantially central point of his or her pupil is taken as an axis, the resin-covered portion forms an angle of 94 degrees or less between a line connecting the central point and an end of the resin-covered portion and the axis.

Thus, the use of the light-transmissive electroconductive material relatively low in electroconductivity can be limited to a maximum range of ergonomically measured fields of view, with the result that the field of view can be spread and coil performance maintained.

The present invention further provides an RF coil for use in the MR imaging apparatus described above. That is to say, the RF coil of the invention includes a plurality of sub-coils. These sub-coils are a first solenoid coil; a second solenoid coil disposed in a form substantially orthogonal to the first coil; and third, fourth, and fifth sub-coils whose sensitivity distributions each become an odd function with a central axis of either solenoid coil as an origin in any one of three directions orthogonal to one another.

Another RF coil of the present invention is a head-imaging RF coil formed up of multiple sub-coils and inclusive of a first sub-coil with multiple current loops, which is formed of a solenoid coil, and of a second sub-coil with multiple current loops and whose sensitivity distribution becomes an odd function with a central axis of the solenoid coil as an origin of the sensitivity distribution; wherein the first sub-coil and the second sub-coil both have a conductor region passing through a plane substantially parallel to a subject's face, the conductor regions themselves of both sub-coils also being parallel to each other and wherein the conductor region of the first sub-coil is disposed at a position closer to the subject's face than the conductor region of the second sub-coil.

EFFECTS OF THE INVENTION

The MR imaging apparatus of the present invention has a receiving coil substantially free of magnetic coupling and improved in G-factor, so the imaging apparatus can apply parallel imaging to obtain high quality images at high speed. In particular, combining three kinds of sub-coils whose sensitivity distributions become odd functions in three orthogonal directions makes an arbitrary phase-encoding direction selectable, thus increasing flexibility of parallel imaging.

In addition, since the MR imaging apparatus of the present invention has a receiving coil with a minimum number of conductor regions covering the required plane (face) of the person to be examined, the imaging apparatus allows the subject's field of view to be ensured and his or her mental oppression to be removed. In particular, a region opposed to the plane can be limited to stay within a required range ergonomically derived, and thus the above effects can be achieved without coil characteristics deterioration by adopting a light-transmissive material.

3-1 . . . Solenoid coil (first sub-coil), 4-1 . . . Saddle coil (second sub-coil), 5-1 . . . Third sub-coil, 6-1 . . . Fourth sub-coil, 7-1 . . . Fifth sub-coil, 101 . . . Magnet for generating a static magnetic field, 102 . . . Coil for generating a gradient magnetic field, 103 . . . Object to be examined (Subject), 104 . . . Sequencer, 105 . . . Power supply for gradient magnetic field, 106 . . . RF pulse generator, 107 . . . Transmit coil, 115 . . . RF power amplifier, 108 . . . Receiver, 109 . . . Computer, 110 . . . Display, 111 . . . Storage medium, 112 . . . Shim coil, 113 . . . Shim power supply, 116 . . . Receiving coil

BEST MODE FOR CARRYING OUT THE INVENTION

Embodiments of an MR imaging apparatus according to the present invention and of an RF coil mounted in the imaging apparatus will be described hereunder.

Figure 1A:
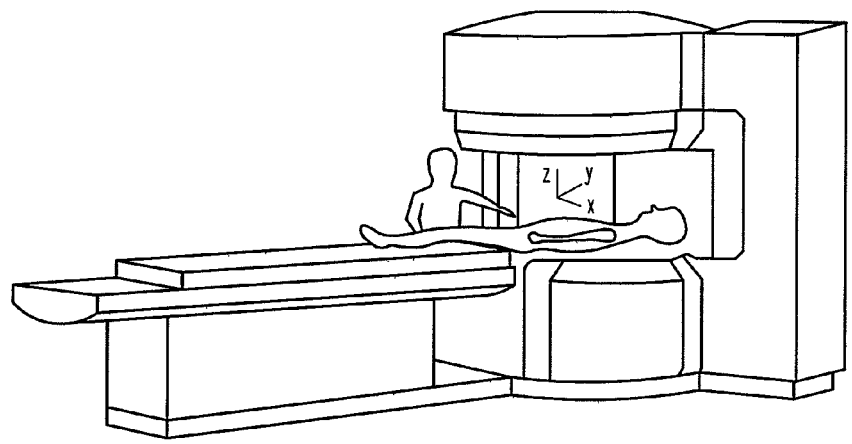
FIG. 1A is an external view of an MR imaging apparatus to which the present invention is applied.
Figure 1B:
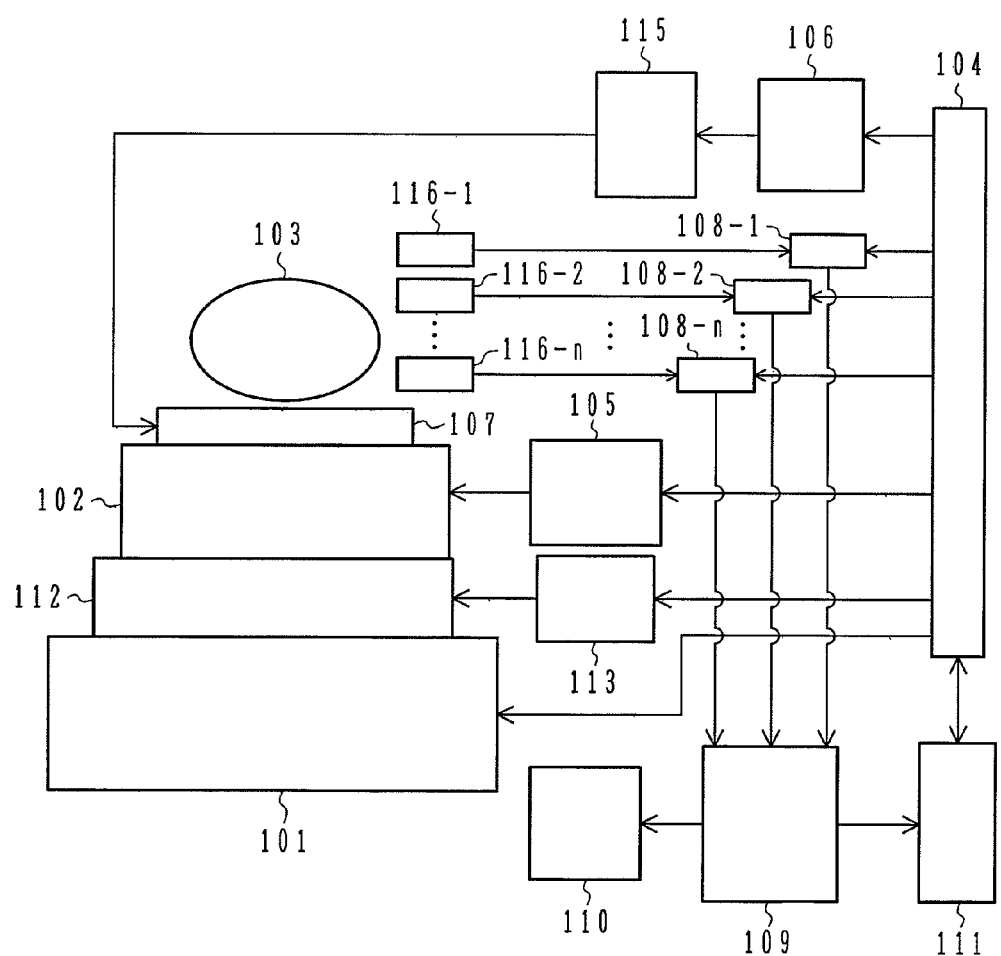
FIG. 1B is a diagram showing a configuration of the MR imaging apparatus to which the present invention is applied.

An external view of the MR imaging apparatus is shown in FIG. 1A, and an example of the configuration is shown in FIG. 1B. The MR imaging apparatus includes a magnet 101 that generates a static magnetic field in a vertical direction, a gradient magnetic field coil 102 that generates a gradient magnetic field, a transmit coil 107 that emits RF pulses, a receiving coil 116 that receives nuclear magnetic resonance signals stemming from an object 103 to be examined, a sequencer 104, a computer 109, and other devices. The transmit coil 107 and the receiving coil 116 are installed in the magnet 101 and the gradient magnetic field coil 102.

The number of magnets shown as 101 is one in FIG. 1B. As shown in FIG. 1A, however, the imaging apparatus actually has one pair of magnets, upper and lower, with the examination object therebetween. The subject 103 is loaded in a lying position into a space sandwiched between the paired magnets.

The gradient magnetic field coil 102 is constructed of gradient magnetic field coils of three axes orthogonal to one another. The gradient magnetic field coils of the three axes are each connected to a gradient magnetic field power supply 105. The transmit coil 107 is connected to an RF pulse generator 106 via an RF power amplifier 115. The sequencer 104 sends an instruction to the gradient magnetic field power supply 105 and the RF pulse generator 106, thus causing the gradient magnetic field coil 102 and the transmit coil 107 to generate the gradient magnetic field and the RF pulses, respectively. When an output of the RF pulse generator 106 is amplified by the RF power amplifier 115 and applied to the transmit coil 107, the RF pulses are applied to the subject 103 through the transmit coil 107.

A nuclear magnetic resonance signal that has stemmed from the examination object 103 is received by the receiving coil 116. The receiving coil 116 is constructed of multiple sub-coils, 116-1 to 116-n. Details of the receiving coil 116 will be described later. The signal that has been received by the receiving coil 116 is A/D converted (sampled) and detected by a receiver 108. A central frequency (magnetic resonance frequency) that is used as a basis for the detection is set via the sequencer 104. The detected signal is sent to the computer 109 in which the signal is re-sampled and then subjected to processing such as imaging apparatus construction. Results are displayed on a display 110.

Signals and measuring parameters can also be stored into a storage medium 111 as required. A shim coil 112 is used to adjust uniformity of the static magnetic field. The shim coil 112 is formed up of multiple channels and supplied with a current from a shim power supply 113. The sequencer 104 controls the current flowing through various coils of the multiple channels, and under the sequencer control, the shim coil 112 generates an additional magnetic field to perform corrections for nonuniformity of the static magnetic field. The sequencer 104 controls each device so that the device operates in programmed timing and with programmed strength. Of these programmed parameters, those relating particularly to the application of the RF pulses, application of the static magnetic field, receiving timing of the nuclear magnetic resonance signals, and strength levels of the RF pulses and the static magnetic field are collectively called an imaging sequence.

Next, the receiving coil used in the MR imaging apparatus of the present invention will be described.

Figure 2:
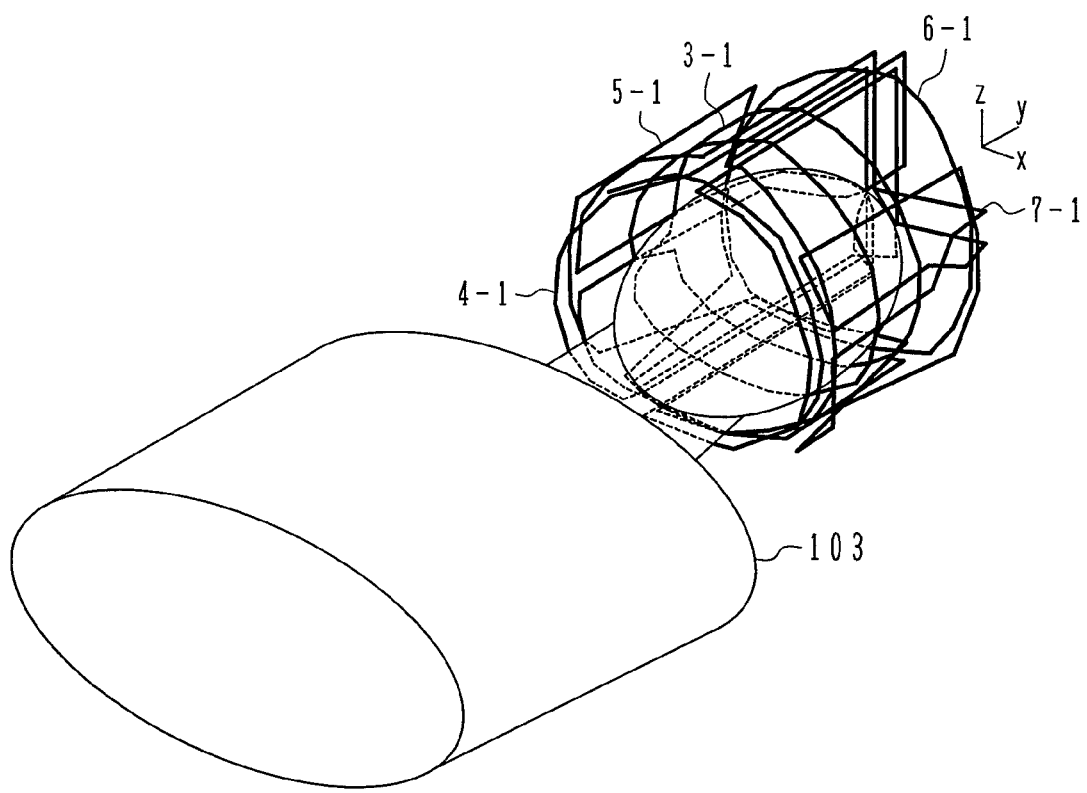
FIG. 2 is a diagram showing a first embodiment of a receiving coil of the present invention.

A first embodiment of the receiving coil in the present invention is described first. A perspective view of the receiving coil according to the first embodiment of the invention is shown in FIG. 2, and the sub-coils constituting the receiving coil are shown in FIGS. 3 to 7. In the description given below, the static magnetic field direction (vertical direction) is defined as a z-direction, and two directions orthogonal thereto and orthogonal to each other are defined as an x-direction and a y-direction. In the illustrative examples, a right/left direction of the subject 103 is defined as the x-direction, and a body-axis direction as the y-direction.

As shown in FIG. 2, the receiving coil according to the present embodiment includes five kinds of sub-coils, 3-1, 4-1, 5-1, 6-1, and 7-1. In the figure, coil portions concealed behind the subject 103 when viewed from a direction of a viewing point are shown in a dotted line. Of the five kinds of sub-coils, the sub-coil 3-1 is a solenoid coil (first solenoid coil) that detects mainly a magnetic field generated in the y-direction, and the sub-coil 4-1 is a two-turn solenoid coil (second solenoid coil, saddle coil) that detects mainly a magnetic field generated in the x-direction. Hereinafter, the sub-coil 3-1 and the sub-coil 4-1 are also called the solenoid coil and the saddle coil, respectively. Also, the sub-coils 5-1, 6-1, and 7-1 are each a counter-rotation coil whose sensitivity distribution becomes an odd function in the x-, y-, or z-direction, respectively, when a central portion of a sensitivity distribution of the solenoid coil 3-1, 4-1 is defined as an origin of the sensitivity distribution. Hereinafter, the counter-rotation coils are also called the odd-function coils. These sub-coils are not magnetically coupled to one another or are magnetically decoupled, so each sub-coil can receive signals at the same time. In addition, since the receiving coil includes the sub-coils whose sensitivity distributions each become an odd function in one of the three orthogonal directions (i.e., the x-, y-, or z-direction), an arbitrary phase-encoding direction can be selected in parallel imaging.

The sensitivity distribution of the odd function here means that when a vertical axis is taken for sensitivity and a horizontal axis for either the x-, y-, or z-direction, the distribution becomes point-symmetric with respect to the origin thereof (i.e., right and left halves with the origin as the center, take the same absolute values and have a reversed plus or minus). For example, a sine curve is an odd function.

Configurations of each sub-coil will be next described with reference made to FIGS. 3 to 7.

Figure 3A:
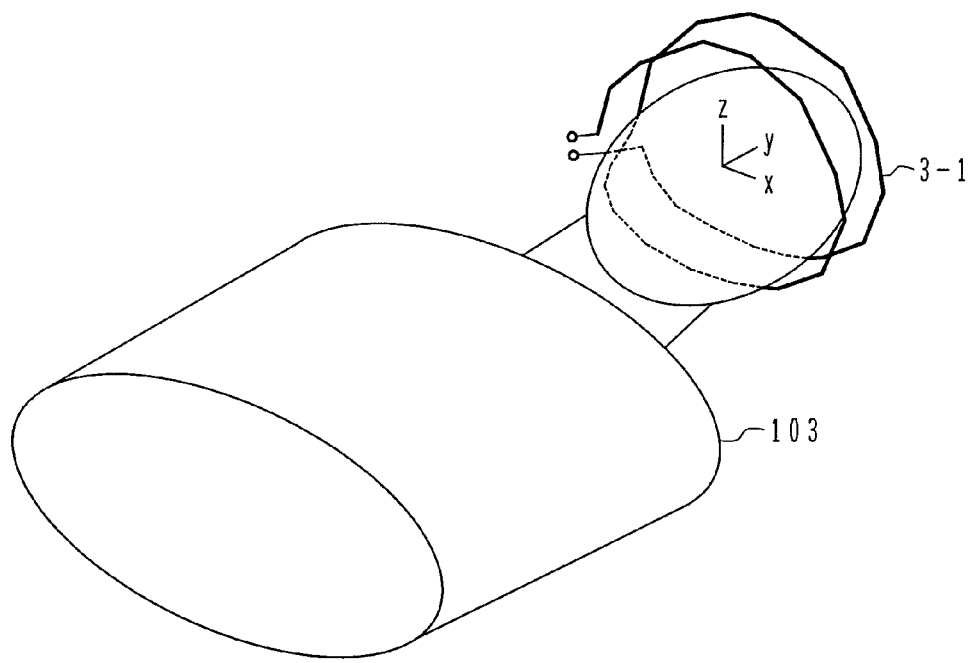
FIG. 3A is a diagram that shows an example of a first sub-coil forming the receiving coil of FIG. 1.
Figure 3B:
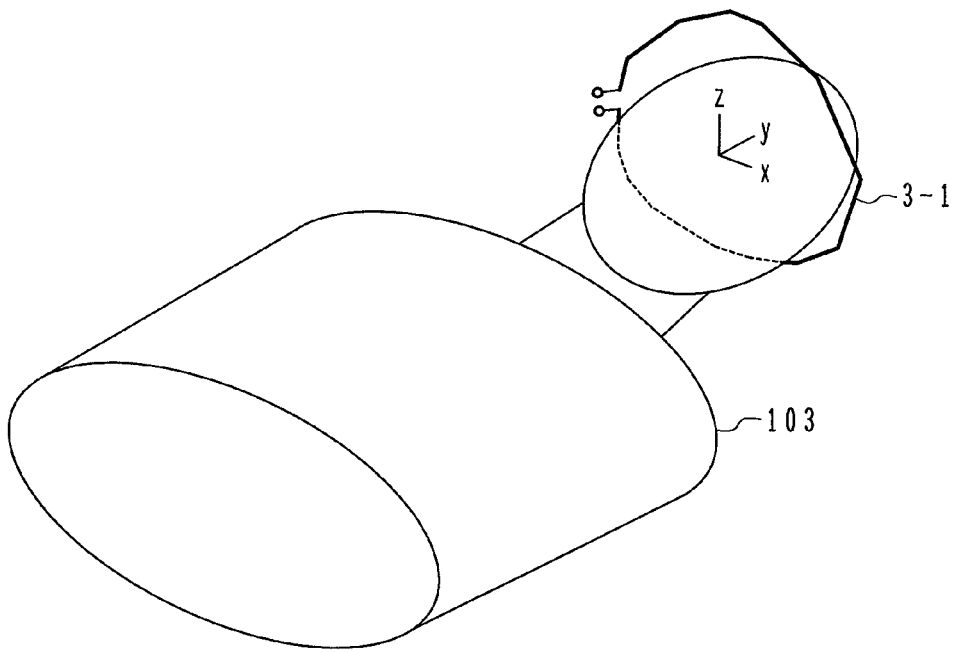
FIG. 3B is a diagram that shows another example of the first sub-coil forming the receiving coil of FIG. 1.

First, the first sub-coil 3-1 is such a two-turn solenoid coil 3-1 as shown in FIG. 3A. A direction of an RF magnetic field which the solenoid coil 3-1 creates when current is supplied thereto agrees primarily with the y-direction and is orthogonal to the z-direction (static magnetic field direction). Although omitted from FIG. 3A, the coil conductor is actually split into a plurality of sections by a capacitor, and a resonance frequency of the coil is matched to a nuclear magnetic resonance frequency. In addition, the first sub-coil 3-1 can be such a one-turn solenoid coil 3-1 as shown in FIG. 3B.

Figure 4:
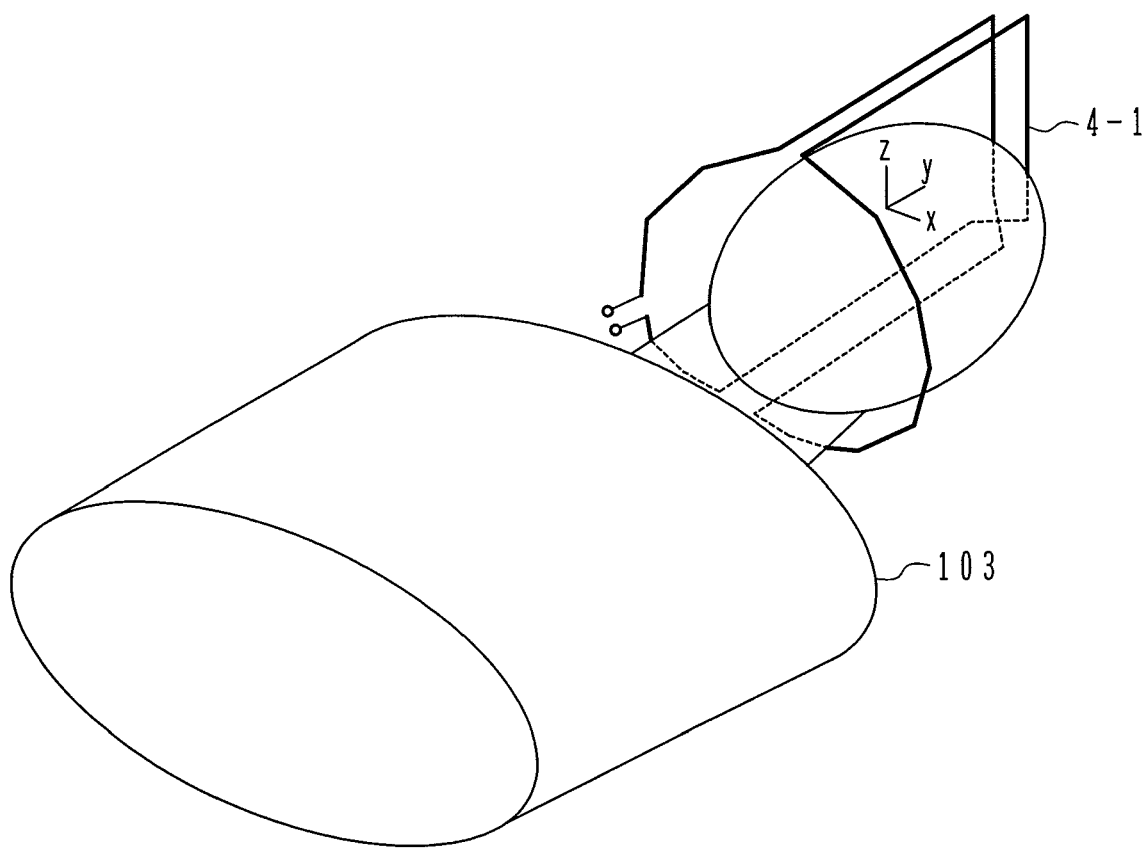
FIG. 4 is a diagram that shows a second sub-coil forming the receiving coil of FIG. 1.

The second sub-coil 4-1 is such a two-turn solenoid coil (saddle coil) 4-1 as shown in FIG. 4. A direction of an RF magnetic field which such a solenoid coil 4-1 creates when current is supplied thereto agrees primarily with the x-direction and is orthogonal to the z-direction (static magnetic field direction).

The solenoid coil 3-1 and the saddle coil 4-1 are free of electromagnetic coupling since the directions of the respective RF magnetic fields which the two coils create when current is supplied thereto are orthogonal. A relationship in position between the solenoid coil 3-1 and the saddle coil 4-1, therefore, is not limited. In the present embodiment, however, the solenoid coil 3-1 is disposed almost centrally at a conductor region parallel to the y-direction of the saddle coil 4-1, and peak sensitivity is obtained at crossing sections of both coils.

Figure 5:
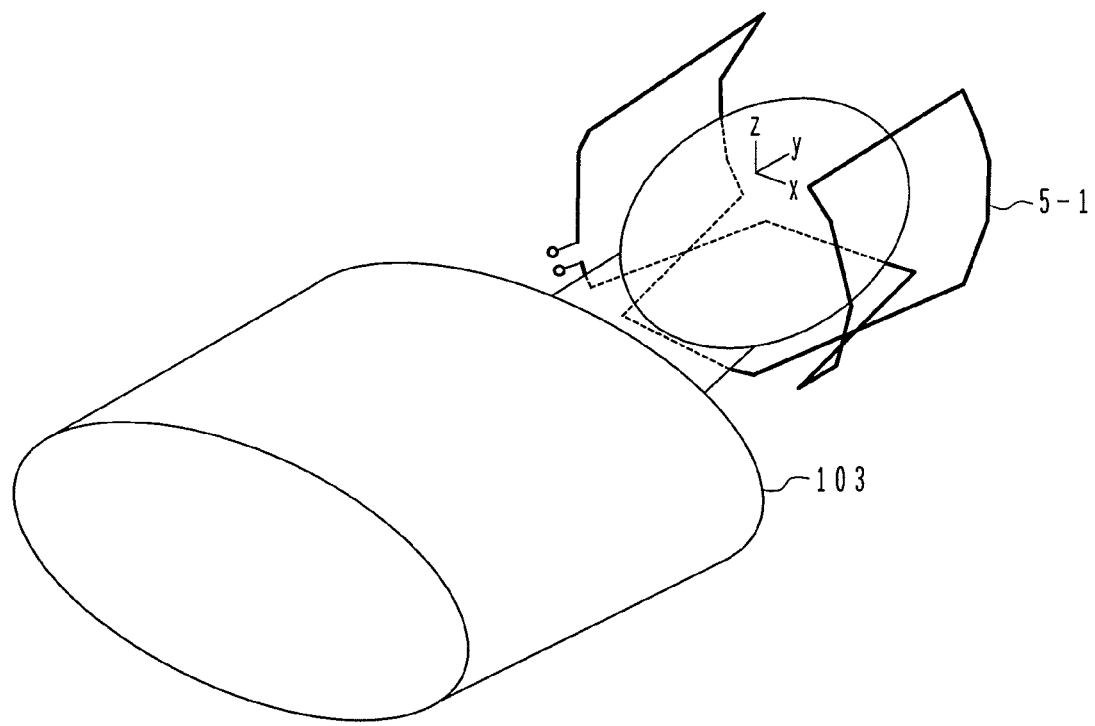
FIG. 5 is a diagram that shows a third sub-coil forming the receiving coil of FIG. 1.
Figure 8A:
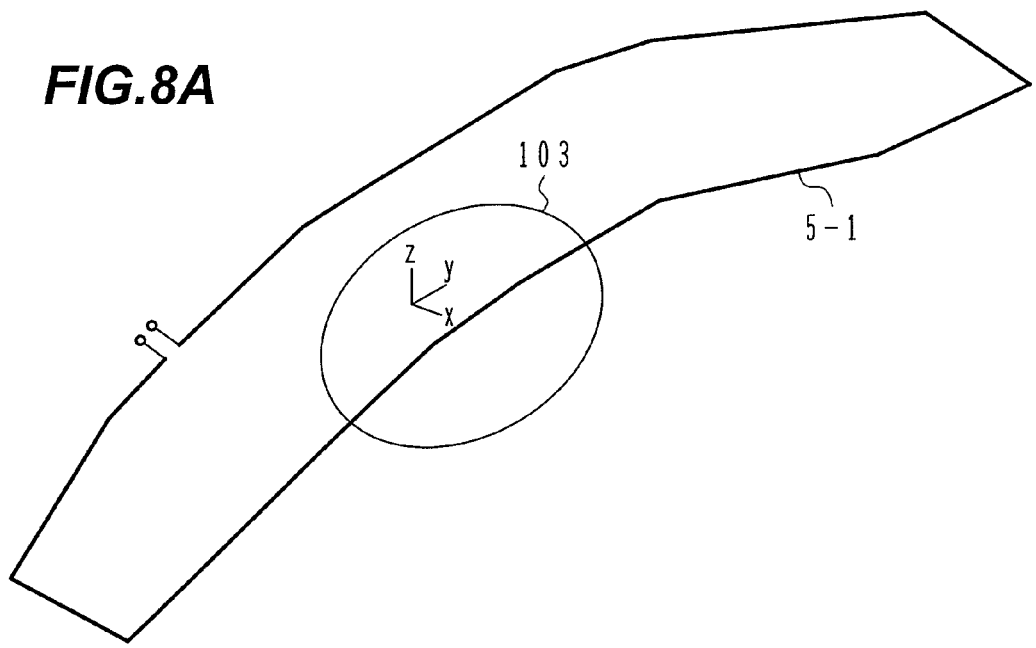
FIG. 8A is a view explaining a structural example of the third sub-coil.
Figure 8B:
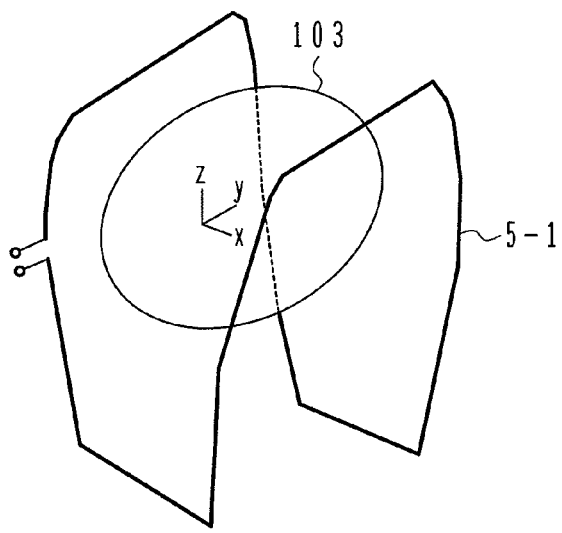
FIG. 8B is a view explaining another structural example of the third sub-coil.
Figure 8C:
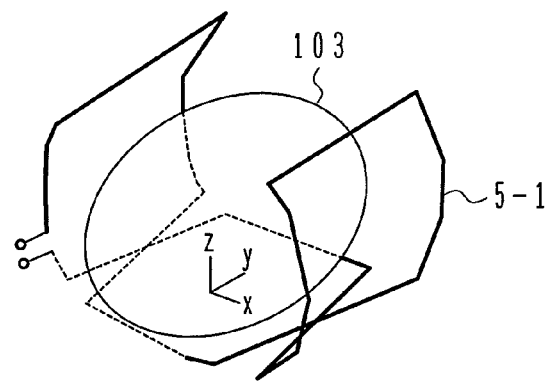
FIG. 8C is a view explaining yet another structural example of the third sub-coil.
Figure 9:
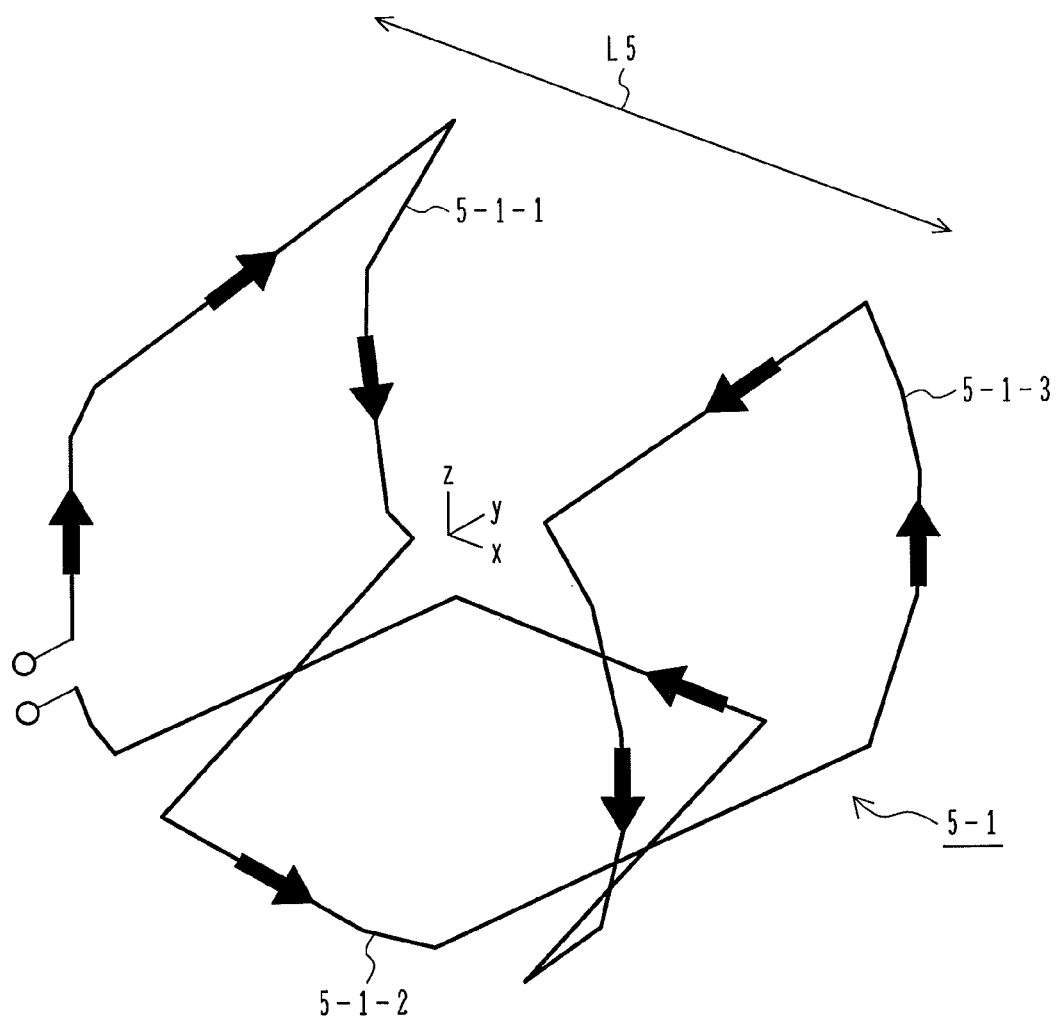
FIG. 9 is a diagram showing a current distribution obtained on the third sub-coil.
Figure 10A:
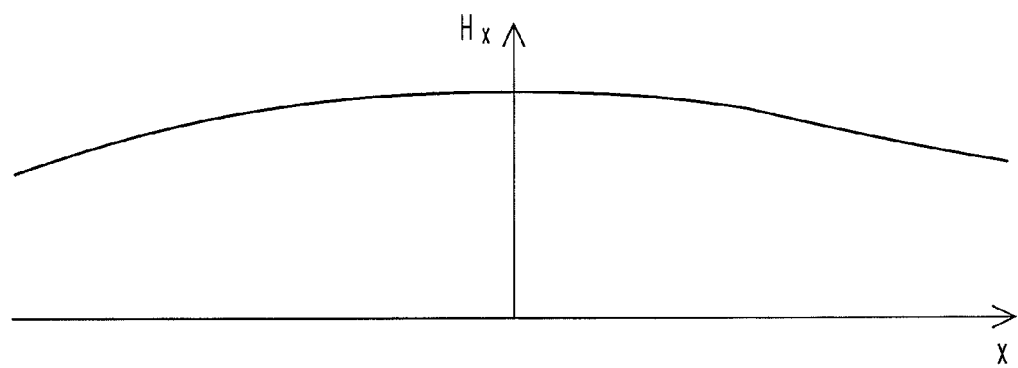
FIG. 10A is a diagram showing an example of an x-direction sensitivity distribution of the second sub-coil.
Figure 10B:
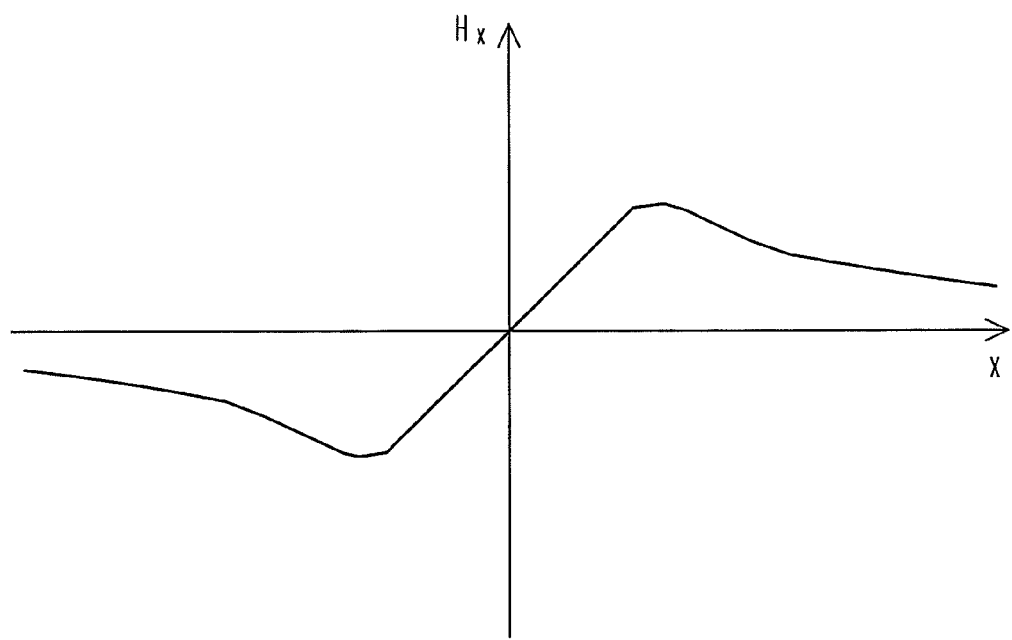
FIG. 10B is a diagram showing another example of an x-direction sensitivity distribution of the third sub-coil.

As shown in FIG. 5, the third sub-coil 5-1 is disposed on the surface of the subject's body and has three adjacent current loops. The coil 5-1 with the three current loops is a loop coil extending in the y-direction, as shown in FIG. 8A, and the coil 5-1 is wound around a peripheral region of the subject 103, as shown in FIGS. 8B and 8C. A current distribution obtained on the coil is shown in FIG. 9. An RF magnetic field which a first current loop 5-1-1 creates is oriented in a minus x-direction (−x), and an RF magnetic field which a third current loop 5-1-3 creates is oriented in a plus x-direction (+x). Since the RF magnetic fields created by both loops counteract each other, the RF magnetic field in the x-direction in a central region of the sub-coil 5-1 becomes almost zero. Strength of the RF magnetic field (Hx) in the x-direction, created on an x-axis by the sub-coil 5-1, is shown in FIG. 10B. The figure reveals that the strength is opposite in polarity and equal in magnitude with respect to the origin (x=0), which indicates that an odd function is obtained.

The third sub-coil 5-1 is disposed so that the central region thereof in the x-direction agrees with that of the saddle coil 4-1 in the x-direction. This makes electromagnetic coupling removable from both coils. That is to say, as shown in FIG. 10A, the strength (sensitivity distribution) of the RF magnetic field which the two-turn solenoid coil (saddle coil) 4-1 creates when current is supplied thereto takes an even function in the x-direction.

Therefore, when the sub-coil 5-1 whose sensitivity distribution takes an odd function in the x-direction is disposed so that origins of the above two coils agree with each other, no electromagnetic coupling occurs between the two coils. Regarding a relationship with respect to the solenoid coil 3-1, the sub-coil 5-1 is free of electromagnetic coupling to the solenoid coil 3-1 since the direction (x-direction) of the RF magnetic field created when current is supplied to the sub-coil 5-1 is orthogonal to the direction (y-direction) of the RF magnetic field created when current is supplied to the solenoid coil 3-1.

Figure 11:
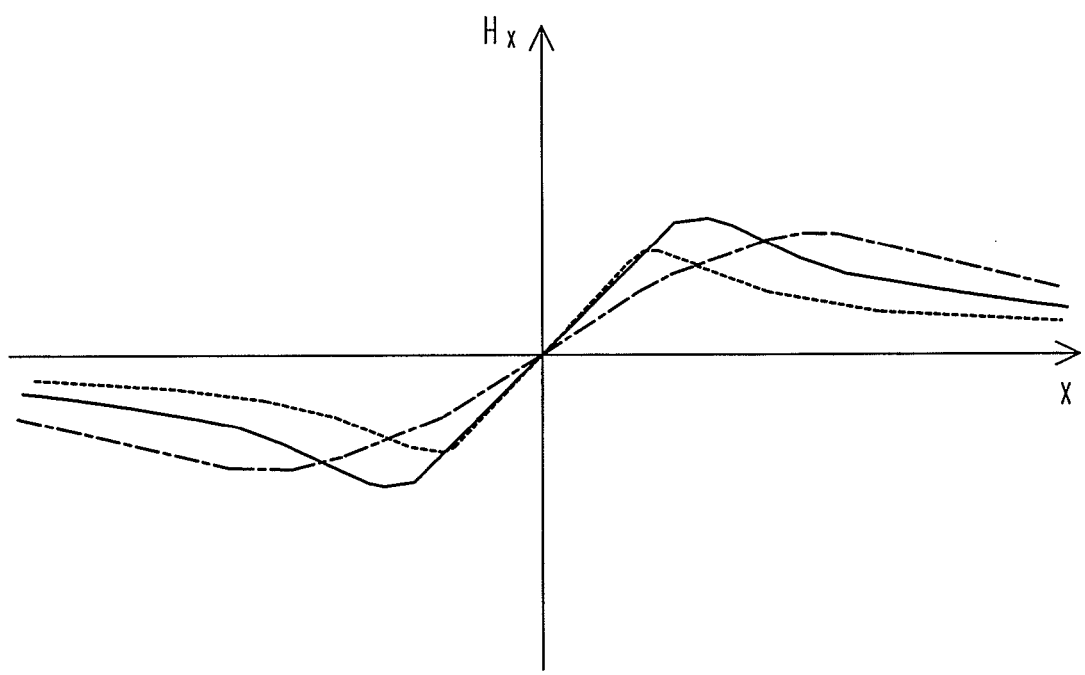
FIG. 11 is a diagram that shows sensitivity distribution curves of the third sub-coil under different inter-loop-distance conditions.

To derive positional relationships of the sub-coil 5-1 and saddle coil 4-1 with respect to the subject in a distance direction, it is necessary to consider the sizes and sensitivity levels of these coils. The sensitivity of the saddle coil 4-1 increases with decreases in the coil size (current loop size). For this reason, the coil is disposed as close as possible to the subject. The peak sensitivity of the sub-coil coil 5-1, however, does not always increase with decreases in the coil size. FIG. 11 shows x-axial sensitivity distributions of the sub-coil 5-1 that are obtained when distance L5 between the first current loop 5-1-1 and the third current loop 5-1-3 is changed to 20 cm, 30 cm, and 40 cm. A dotted line denotes the x-axial sensitivity distribution of the sub-coil 5-1, obtained when L5=20 cm, a solid line denotes the distribution obtained when L5=30 cm, and a dashed-dotted line denotes the distribution obtained when L5=40 cm. FIG. 11 indicates that the highest peak sensitivity can be obtained when L5=30 cm. This fact means that reducing the size of the sub-coil 5-1 having three current loops does not necessarily work advantageously in the improvement of sensitivity. The saddle coil 4-1 is therefore disposed closer to the subject than the sub-coil 5-1, whereby the peak sensitivities of both coils can be optimized.

The above-described arrangement of the saddle coil 4-1 and the sub-coil 5-1 causes a sub-coil of a different sensitivity distribution to exist in the x-direction, so during parallel imaging, a foldover of an image can be separated by selecting the x-direction as an MR image phase-encoding direction. In addition, the G-factor obtained when the x-direction is selected as the phase-encoding direction can be improved by disposing the saddle coil 4-1 in closer proximity to the subject than the sub-coil 5-1 and maximizing the peak sensitivities of both coils.

Figure 6:
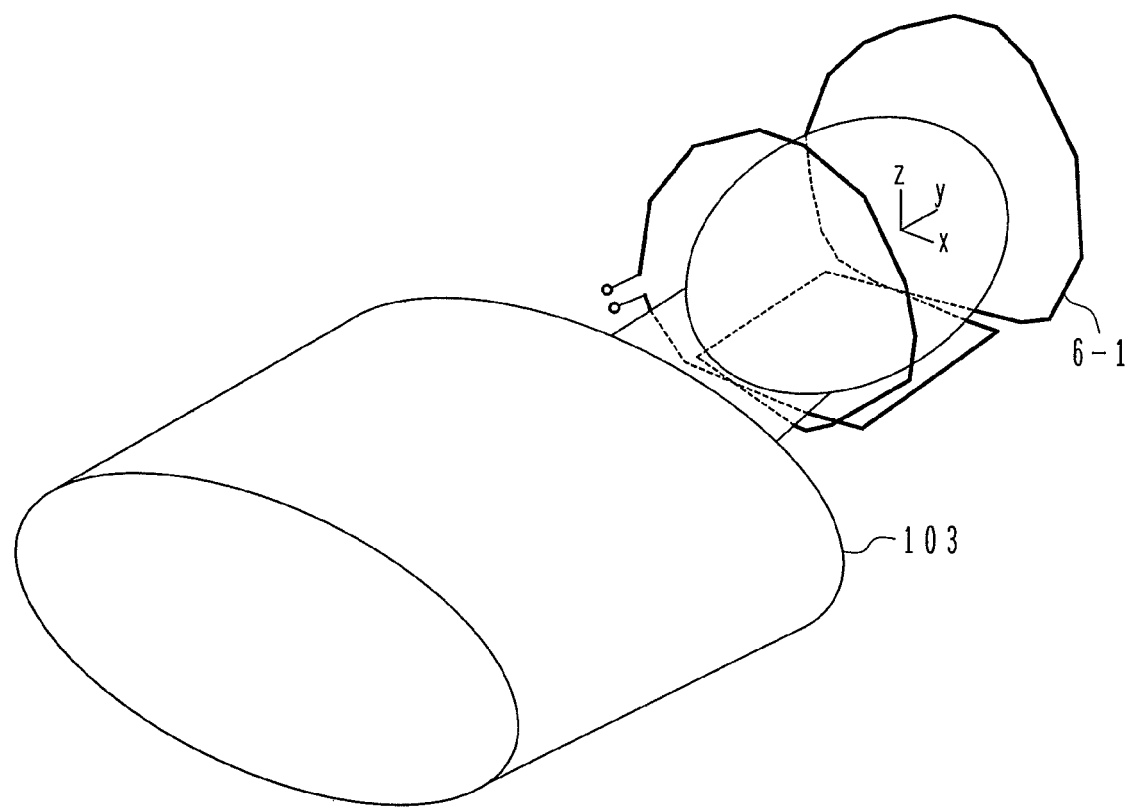
FIG. 6 is a diagram that shows a fourth sub-coil forming the receiving coil of FIG. 1.
Figure 12A:
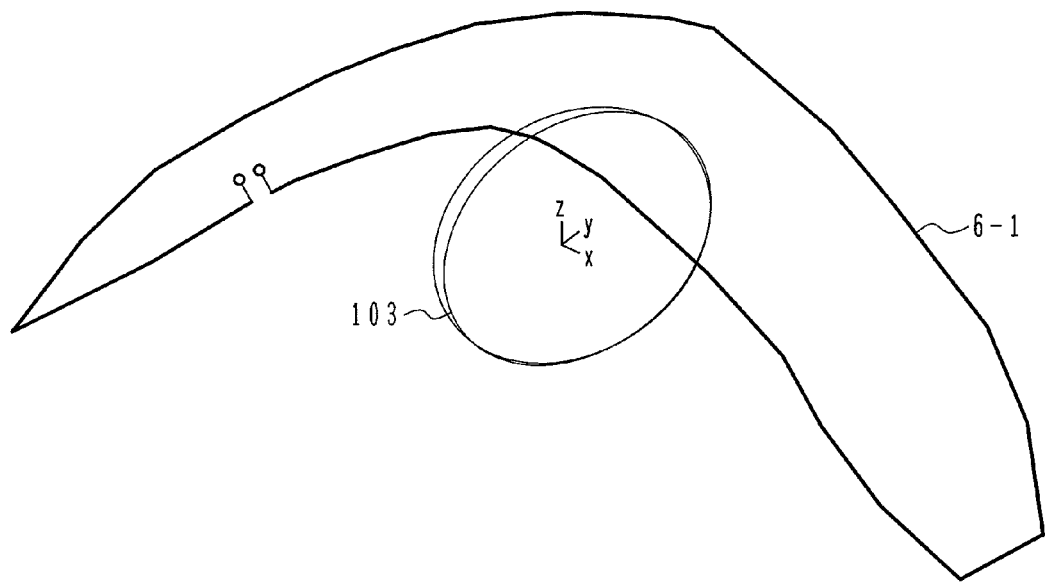
FIG. 12A is a view explaining a structural example of the fourth sub-coil.
Figure 12B:
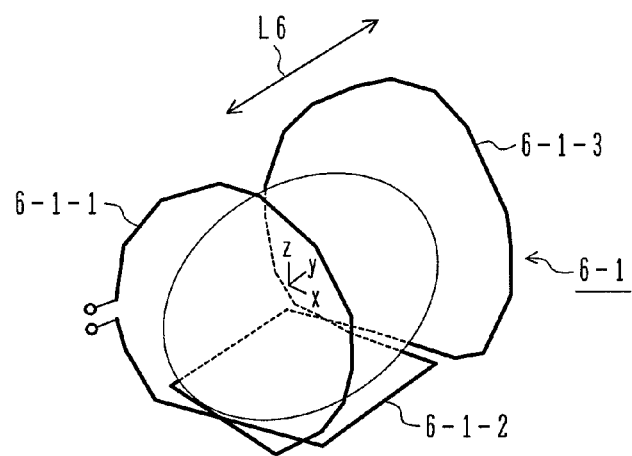
FIG. 12B is a view explaining another structural example of the fourth sub-coil.
Figure 13A:
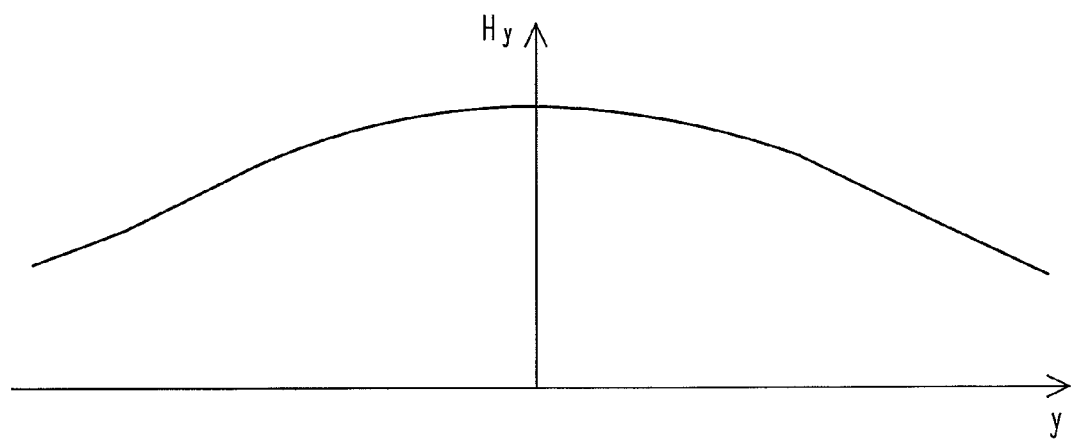
FIG. 13A is a diagram showing an example of a y-direction sensitivity distribution of the first sub-coil.
Figure 13B:
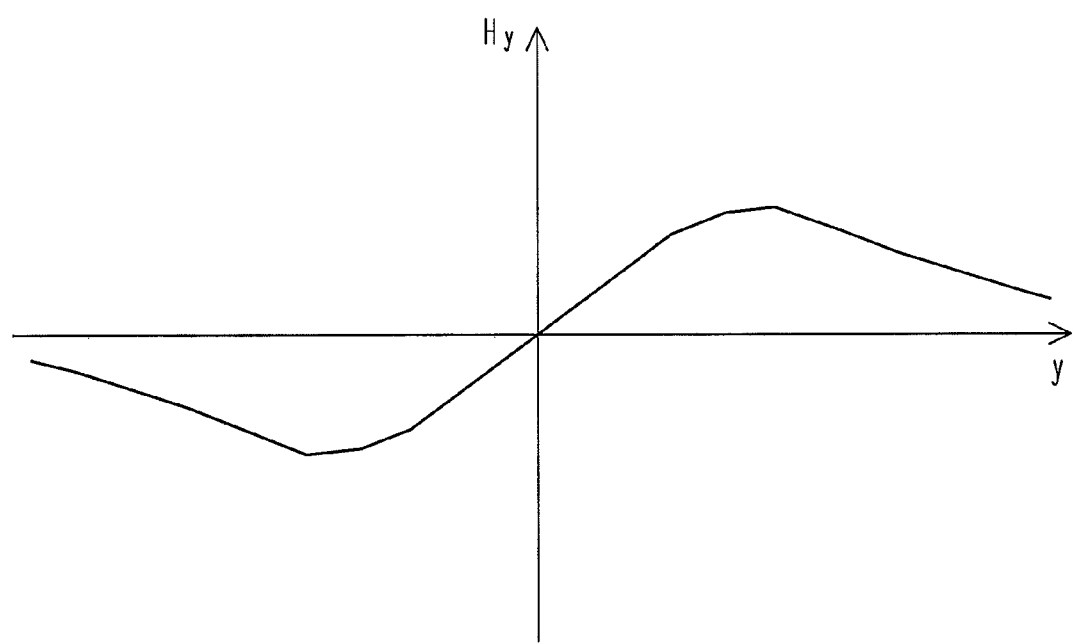
FIG. 13B is a diagram showing another example of a y-direction sensitivity distribution of the fourth sub-coil.

The fourth sub-coil 6-1 is such a coil 6-1 with three adjacent current loops as shown in FIG. 6. The coil 6-1 with three current loops is a loop coil extending in the x-direction, as shown in FIG. 12A, and the coil 6-1 is wound around the peripheral region of the object to be imaged, as shown in FIG. 12B. In the sub-coil 6-1, as in the sub-coil 5-1, polarity of an RF magnetic field in the y-direction which a first current loop 6-1-1 creates and polarity of an RF magnetic field in the y-direction which a third current loop 6-1-3 creates are opposite, and the RF magnetic fields created by both loops counteract each other. The RF magnetic field in the y-direction in a central region of the sub-coil 6-1, therefore, becomes almost zero. Strength of the RF magnetic field (Hy) in the y-direction, created on a y-axis by the sub-coil 6-1, is shown in FIG. 13B. The figure reveals that the strength is opposite in polarity and equal in magnitude with respect to the origin (y=0), which indicates that an odd function is obtained.

The sub-coil 6-1 is disposed so that a y-axial central region thereof agrees with that of the sub-coil (two-turn solenoid coil) 3-1 shown in FIGS. 3A and 3B. In this arrangement, no electromagnetic coupling occurs between both coils. That is to say, as shown in FIG. 13A, the strength (sensitivity distribution) of the RF magnetic field which the two-turn solenoid coil 3-1 creates when current is supplied thereto takes an even function in the y-direction. Therefore, when the coil 3-1 is disposed so that a y-direction origin of the coil and that of the coil 6-1 whose sensitivity distribution takes an odd function in the y-direction agree with each other, no electromagnetic coupling occurs between the two coils. In terms of the relationship with respect to the saddle coil 4-1, each coil is free of electromagnetic coupling since the directions of the RF magnetic fields created by each coil when current is supplied thereto are orthogonal.

Figure 14:
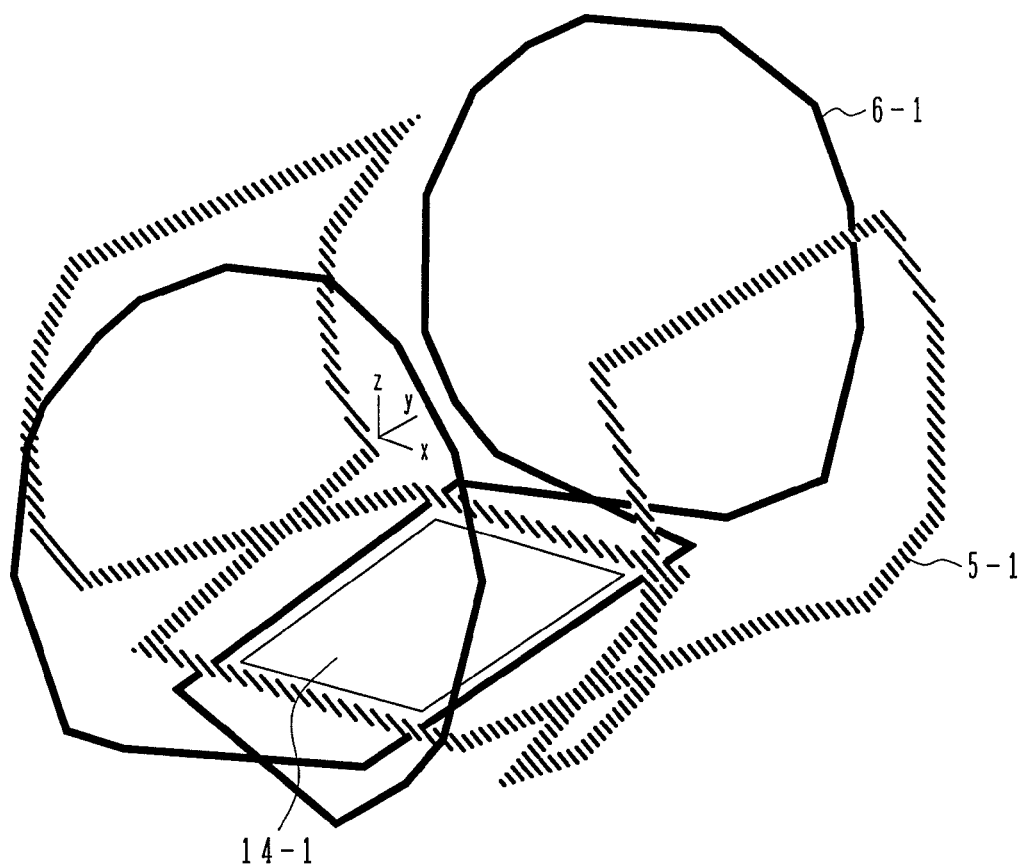
FIG. 14 is a diagram showing the relationship between the third sub-coil and the fourth sub-coil.

In terms of the relationship with respect to the sub-coil 5-1, however, since the two coils each having three adjacent current loops are arranged to be orthogonal to each other, electromagnetic coupling between both coils is too strong to suppress, even by using a known method of suppressing electromagnetic coupling. In the present embodiment, therefore, overlaps 14-1 of the two coils are adjusted in area, as shown in FIG. 14, to reduce electromagnetic coupling between both coils to a practically negligible level.

The adjustment of the areas can be achieved using, for example, the procedure below. First, a Q-value of a resonance peak of input impedance occurring when the sub-coil 5-1 or 6-1 exists alone is measured for both coils. Next as shown in FIG. 14, the two sub-coils are arranged orthogonally to each other. If the areas of the overlaps 14-1 of the two coils are inappropriate, the Q-values of the respective resonance peaks of the input impedance decrease, compared with the Q-value obtained when the coil exists alone. If mutual inductive coupling is too strong, a resonance point of the input impedance of the coil is split into at least two sections. The areas of the overlaps 14-1 are varied so that the Q-values of the respective resonance peaks of the input impedance of each coil are as close as possible to the Q-value obtained when the coil is present alone. The areas of the overlaps 14-1 existing when the Q-values of the respective resonance peaks of the input impedance of each coil are as close as possible to the Q-value obtained when the coil is present alone are each adopted as an optimal value. In this state, if a known method of suppressing magnetic coupling, for example, a magnetic coupling suppression method that applies a low-input-impedance amplifier to detect signals is used, electromagnetic coupling between both coils can be reduced to a practically negligible level.

Positional relationships of the sub-coil 6-1 and solenoid coil 3-1 with respect to the subject in the distance direction between the three elements are substantially the same as the foregoing relationship in position between the sub-coil 5-1 and the saddle coil 4-1. That is to say, the solenoid coil 3-1 increases in sensitivity with decreases in the coil size (current loop size). The coil is therefore disposed as close as possible to the subject. However, peak sensitivity of the coil 6-1 having three adjacent current loops, as with that of the sub-coil 5-1, does not always increase with decreases in the coil size. The peak sensitivity is maximized when distance L6 between the first current loop 6-1-1 and the third current loop 6-1-3 is optimized. As the peak sensitivity is increased, the G-factor also improves when the x-direction is selected as the phase-encoding direction.

As a result of the above-described arrangement of the solenoid coil 3-1 and the sub-coil 6-1, a sub-coil different in sensitivity distribution exists in the y-direction, so a foldover of an MR image can be separated by selecting the y-direction as the phase-encoding direction of the MR image during parallel imaging.

Figure 7:
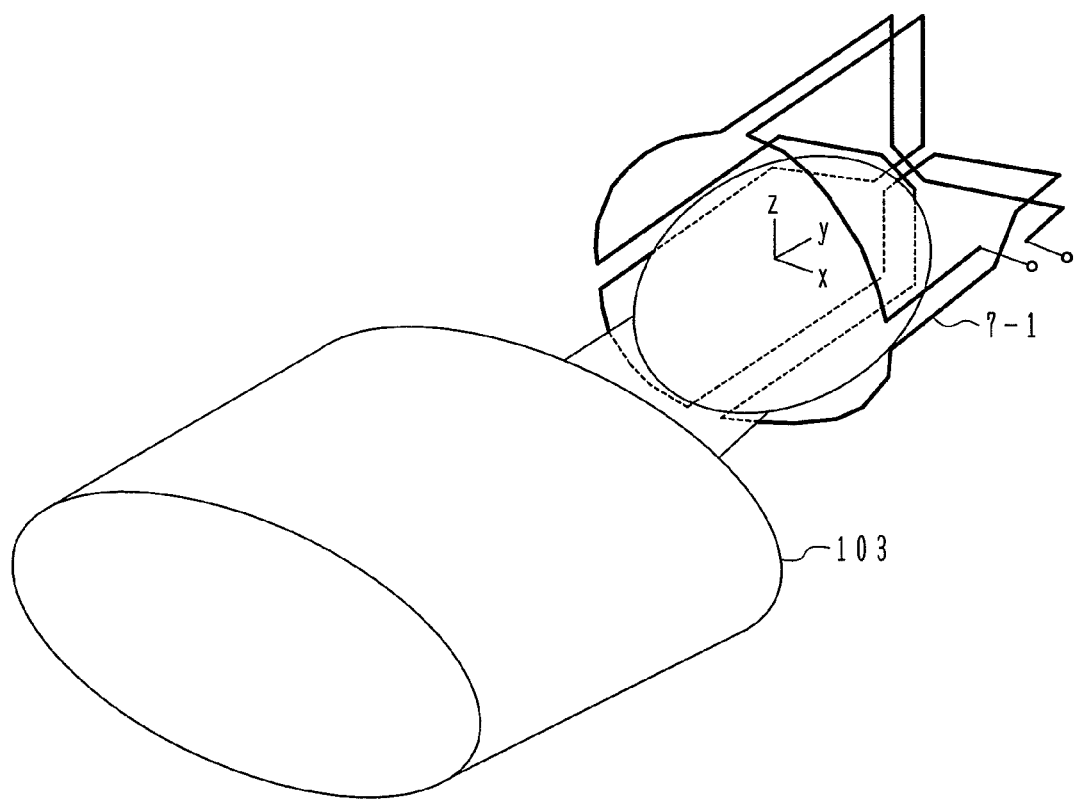
FIG. 7 is a diagram that shows a fifth sub-coil forming the receiving coil of FIG. 1.
Figure 15A:
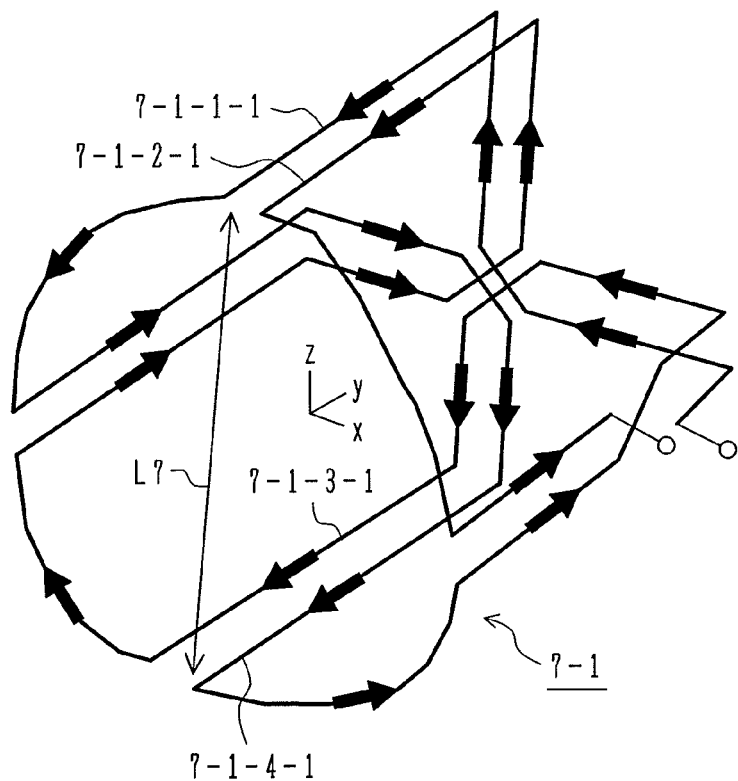
FIG. 15A is a diagram showing an example of a current distribution obtained on the fifth sub-coil.
Figure 15B:
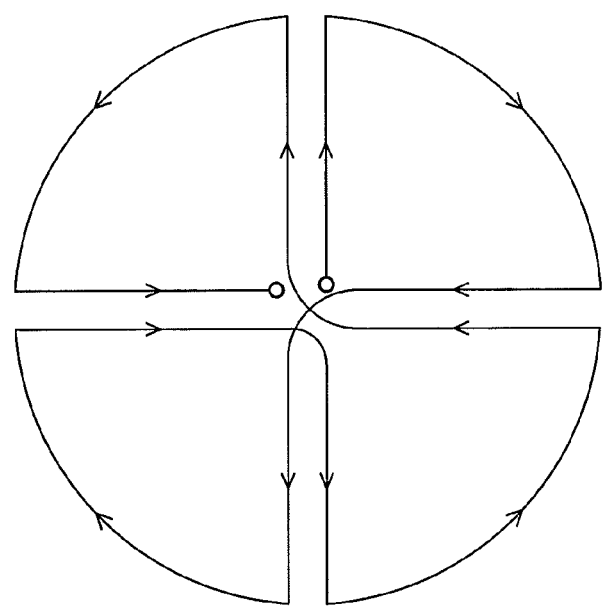
FIG. 15B is a diagram showing another example of a current distribution obtained on the fifth sub-coil.
Figure 16A:
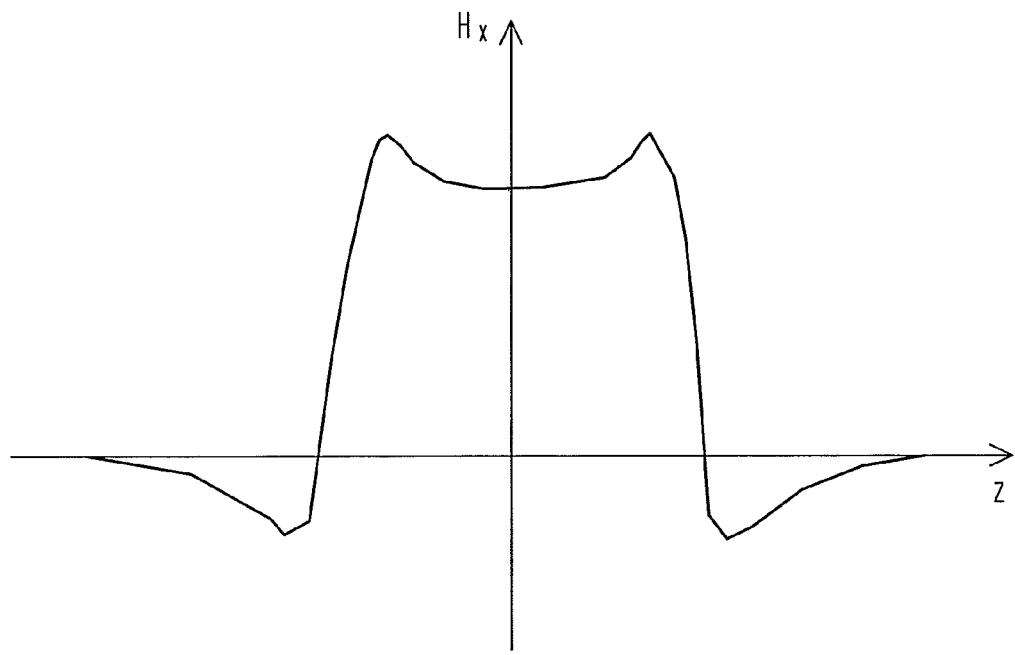
FIG. 16A is a diagram showing an example of a z-direction sensitivity distribution of the second sub-coil.
Figure 16B:
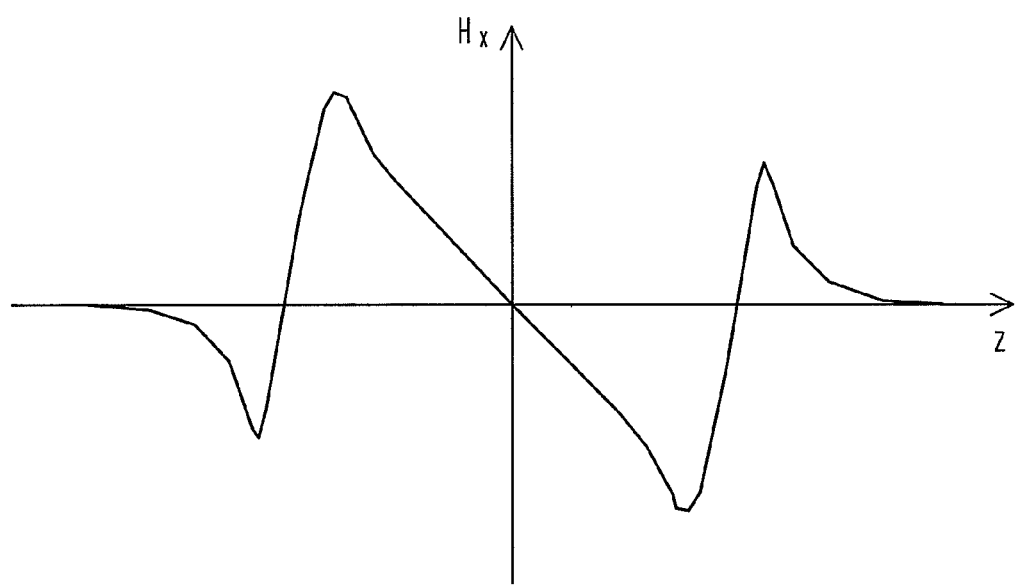
FIG. 16B is a diagram showing another example of a z-direction sensitivity distribution of the fifth sub-coil.

The fifth sub-coil 7-1 has four such adjacent current loops as shown in FIG. 7. A current distribution obtained on this coil and an equivalent circuit of the coil are shown in FIGS. 15A and 15B, respectively. Since each section of the coil has symmetry in a direction of the current, magnitude of the RF magnetic field in a central (y-axial) region of the sub-coil 7-1 becomes substantially zero. Strength of the x-axial RF magnetic field (Hx) which the sub-coil 7-1 creates on a z-axis is shown in FIG. 16B. It can be seen that the strength is opposite in polarity and equal in magnitude with respect to the origin (x=0), and thus that the strength distribution takes an odd function.

The sub-coil 7-1 is disposed so that a z-axial central region thereof agrees with those of the saddle coil 4-1 and sub-coil 5-1. FIG. 16A shows the strength of the RF magnetic field which the saddle coil 4-1 creates when current is supplied thereto and indicates that the strength distribution takes an even function. When the saddle coil 4-1 and the sub-coil 7-1 are disposed so that the respective z-axial central regions agree, no electromagnetic coupling occurs between the two coils. Likewise, when the sub-coil 5-1 and the sub-coil 7-1 are disposed so that their respective z-axial central regions agree, no electromagnetic coupling occurs between the two coils. Between the sub-coils 3-1 and 7-1 and between the sub-coils 6-1 and 7-1, no electromagnetic coupling occurs, either, since each section of the sub-coil 7-1 has symmetry in the direction of the current.

Figure 17:
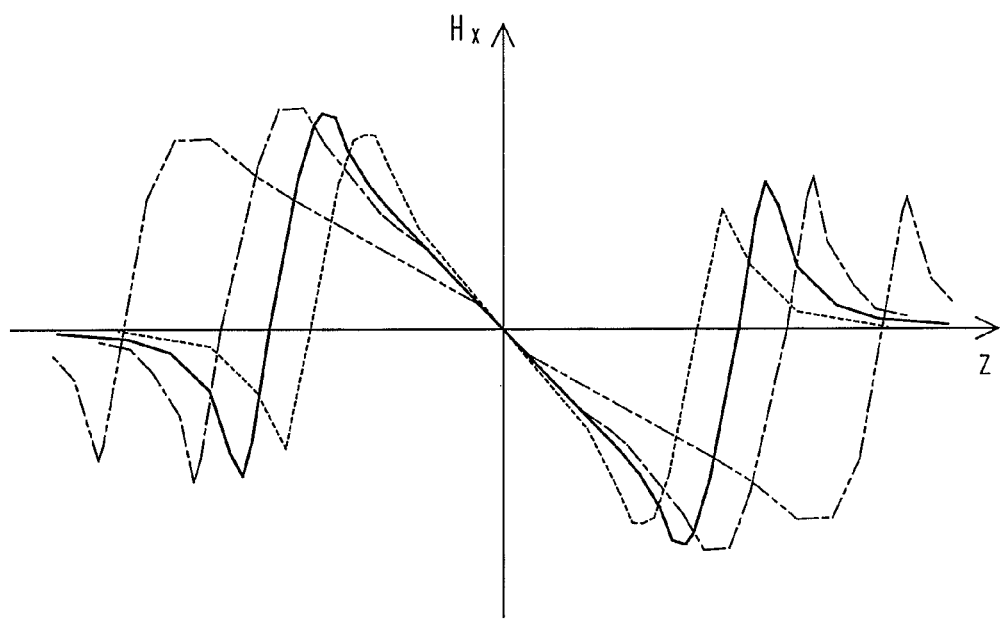
FIG. 17 is a diagram that shows sensitivity distribution curves of the fifth sub-coil under different inter-loop-distance conditions.

Positional relationship of the sub-coil 7-1 with respect to the subject in the distance direction is substantially the same as the positional relationships of the sub-coils 5-1 and 6-1. That is to say, unlike the solenoid coil 3-1 or the saddle coil 4-1, the sub-coil 7-1 does not increase in peak sensitivity with a decrease in the coil size. FIG. 17 shows z-axial sensitivity distributions of the sub-coil 7-1 that are obtained when distance L7 between a conductor 7-1-2-1 forming a part of a second current loop and a conductor 7-1-4-1 forming a part of a fourth current loop is changed to 20 cm, 25 cm, 30 cm, and 40 cm. A dotted line denotes the x-axial sensitivity distribution of the sub-coil 7-1 obtained when L7=20 cm, a solid line denotes the distribution obtained when L7=25 cm, a dashed-dotted line denotes the distribution obtained when L7=30 cm, and a dashed-two-dotted line denotes the distribution obtained when L7=40 cm. The highest peak sensitivity is obtained when L7=25 to 30 cm. This means that reducing the size of the coil 7-1 does not necessarily work advantageously in the improvement of sensitivity. The saddle coil 4-1 is therefore disposed closer to the subject than the sub-coil 7-1, whereby the peak sensitivities of both coils can be optimized.

The above-described arrangement of the saddle coil 4-1 and the sub-coil 7-1 causes a sub-coil of a different sensitivity distribution to exist in the z-direction, so during parallel imaging, a foldover of an MR image can be separated by selecting the z-direction as the image phase-encoding direction of the MR image. It is also possible to maximize the peak sensitivities of both coils and hence to improve the G-factor obtained when the z-direction is selected as the phase-encoding direction.

An embodiment of the receiving coil used in the MR imaging apparatus of the present invention has been described above. According to the present embodiment, during the application of parallel imaging, high sensitivity to depths of the subject's head and high-speed imaging of an arbitrary cross section can be achieved by using the receiving coil that includes the two orthogonal solenoid coils, 3-1 and 4-1, the coil 5-1 whose sensitivity distribution becomes an odd function in the x-direction with the origins of the sensitivity distributions of the solenoid coils 3-1 and 4-1 as the center of the coil 5-1, the coil 6-1 whose sensitivity distribution becomes an odd function in the y-direction, and the coil 7-1 whose sensitivity distribution becomes an odd function in the z-direction with respect to the origin of the sensitivity distribution.

While a receiving coil having two solenoid coils and three odd-function sub-coils has been described in the present embodiment, the present invention is not limited to or by the receiving coil having all the five kinds of sub-coils, and for example, a combination of one solenoid coil and three odd-function sub-coils, a combination of two solenoid coils and two odd-function sub-coils (z-direction and x- or y-direction sub-coils), or various other combinations are adoptable as modifications.

Figure 18:
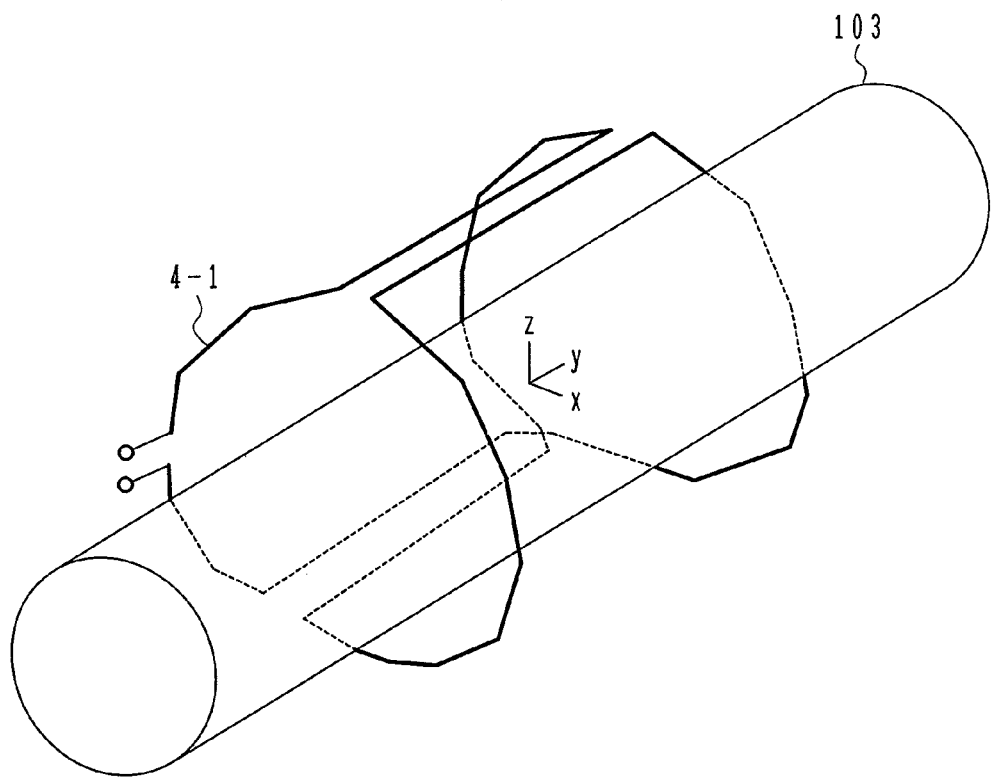
FIG. 18 is a diagram showing a modification of the second sub-coil.
Figure 19:
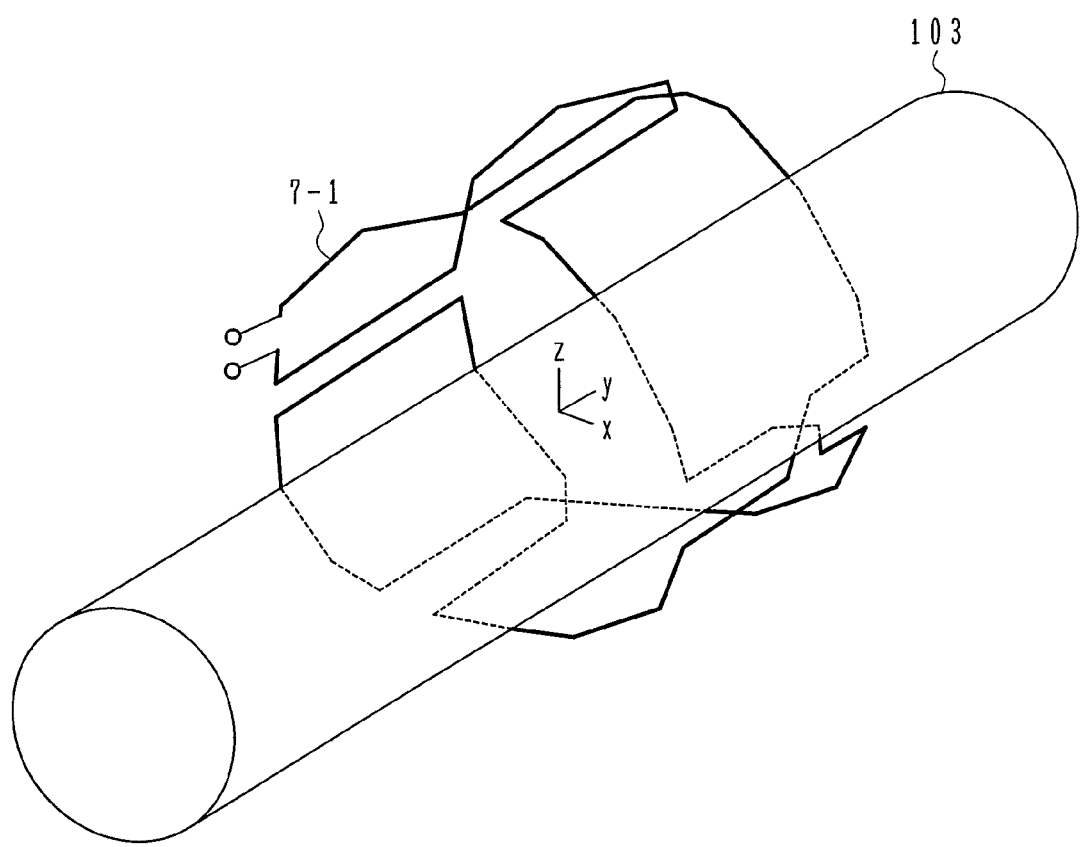
FIG. 19 is a diagram showing a modification of the fifth sub-coil.

In addition, individual sub-coil configurations are not limited to or by those shown and can each be changed in various forms. For example, the saddle coil 4-1 shown as the second sub-coil in FIG. 18 can be the sub-coil 7-1 shown as the fifth sub-coil in FIG. 19. In that case, the sub-coil 7-1 can have four current loops, and the sensitivity distribution of the sub-coil can be an odd function in the z-direction. Using these sub-coils in combination makes parallel imaging applicable to examination of slender body regions such as knees. In this case, the application of parallel imaging also makes it possible to achieve high depth sensitivity and high-speed imaging of an arbitrary cross section, by combining the solenoid coil 3-1, the coil 5-1 whose sensitivity distribution becomes an odd function in the x-direction, and the coil 6-1 whose sensitivity distribution becomes an odd function in the y-direction.

Next, a second embodiment of a receiving coil which the MR imaging apparatus of the present invention uses is described below. It is particularly essential to form a head-imaging coil so that the subject's field of view is kept as open as possible to mitigate mental oppression of the subject. The receiving coil of the second embodiment is a receiving coil for imaging the head, and the coil has its features in arrangement and materials of conductor regions and is constructed to ensure the subject's field of view.

Figure 20:
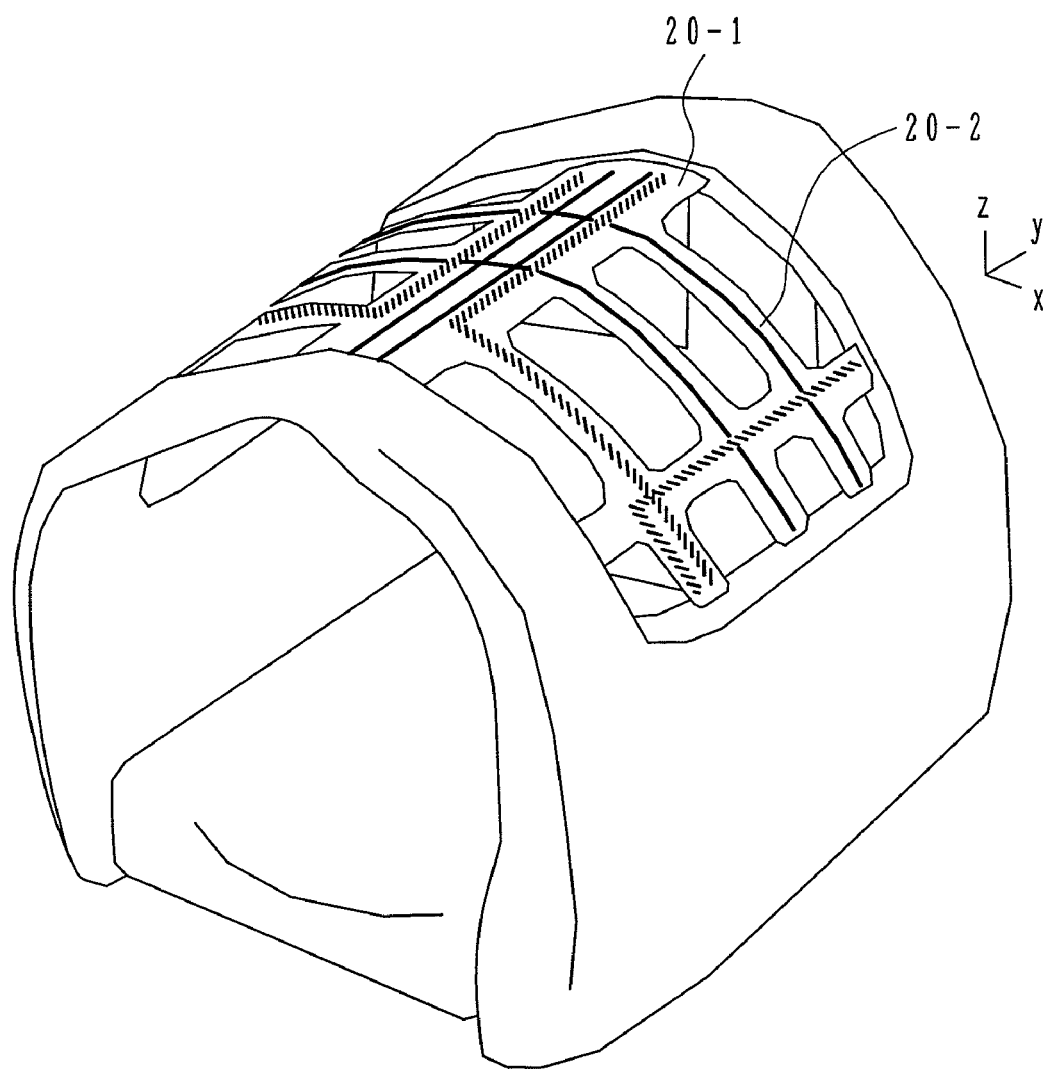
FIG. 20 is a diagram showing a second embodiment of a receiving coil of the present invention.

An external view of the receiving coil of the second embodiment is shown in FIG. 20. Front views of the receiving coil and top views of the coil when seen from the top of the subject's head are shown in FIGS. 21A, 21B and 22A, 22B, respectively. This receiving coil, as with that of the first embodiment, includes a plurality of sub-coils, configurations of which are substantially the same as in the first embodiment. That is to say, although only shown partly in each figure, the receiving coil of the second embodiment is constructed by combining solenoid coils that each detect a magnetic field in either an x-direction or a y-direction (i.e., the sub-coil shown in FIG. 3 and the sub-coil 4-1 shown in FIG. 4) and sub-coils whose sensitivity distributions each become an odd function with respect to origins of the solenoid coils (i.e., sub-coils 5-1, 6-1, and 7-1).

These sub-coils are each protected in shrouded form with a cover formed of an insulator. Front cover 20-1 for the object is constructed of a material having a light-transmitting property. This material having a light-transmitting property is a non-magnetic transparent material, for example, a thermosetting plastic or the like. A copper plate surface that forms a conductor region 20-2 of the coil protected with the cover having a light-transmitting property is plated with aluminum to provide the least possible conspicuous coloration to the conductor region.

Figure 21A:
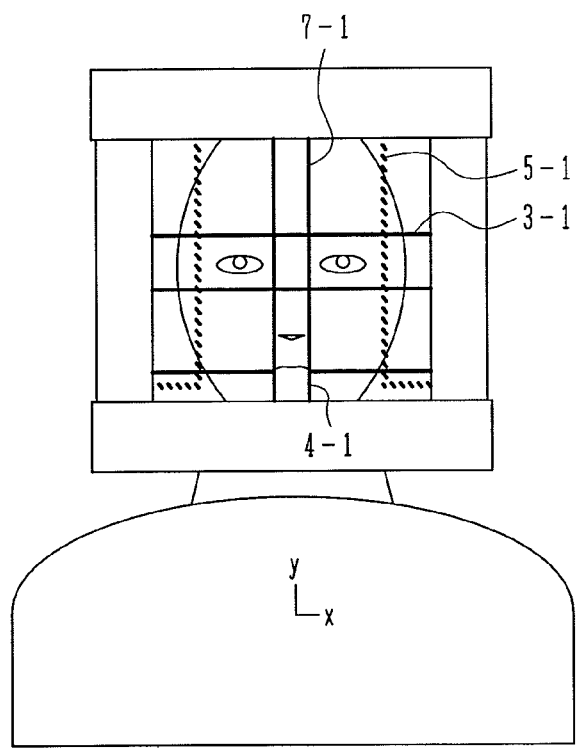
FIG. 21A is a view showing an example of the receiving coil of FIG. 20 from a side of a subject's face.
Figure 21B:
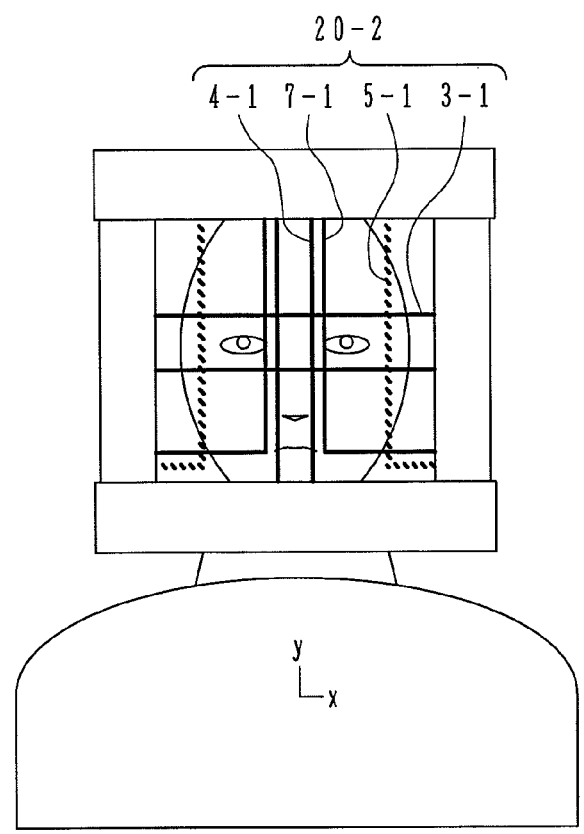
FIG. 21B is a view showing another example of the receiving coil of FIG. 20 from a side of a subject's face.
Figure 22A:
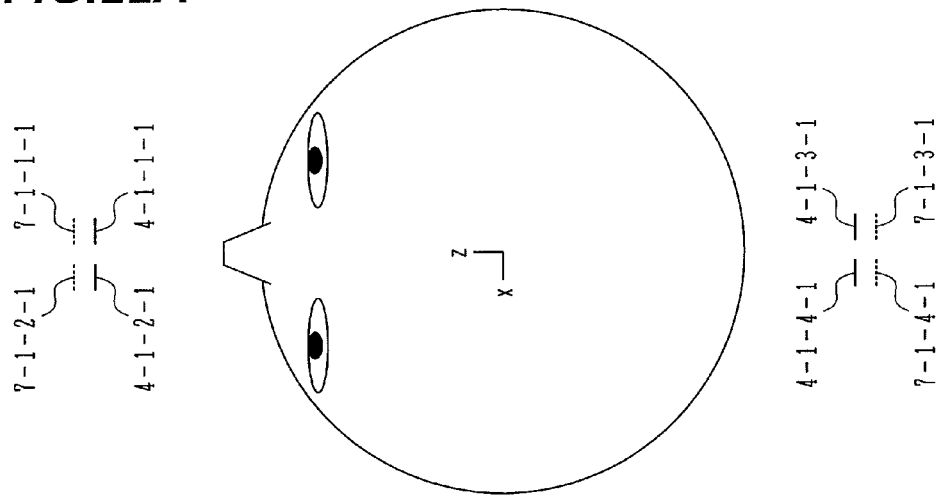
FIG. 22A is a view showing an example of the receiving coil of FIG. 20 from a top of the subject's head.
Figure 22B:
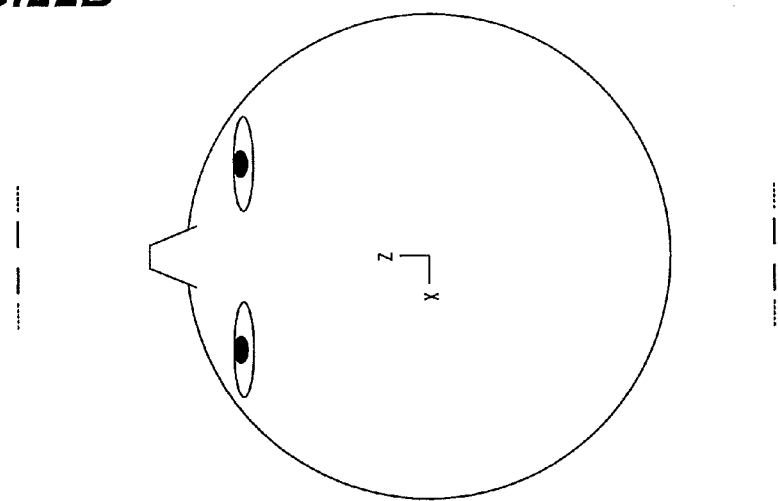
FIG. 22B is a view showing another example of the receiving coil of FIG. 20 from a top of the subject's head.

Additionally as shown in FIGS. 21A and 21B, respective conductor wiring regions of the solenoid coil 3-1, the saddle coil 4-1, the coil 5-1 whose sensitivity distribution becomes an odd function in the x-direction with respect to the origin of the coil, and the coil 7-1 whose sensitivity distribution becomes an odd function in the z-direction with respect to the origin of the coil are arranged so as to skirt a front region of the subject's eyes as far as possible. This provides a visual field as wide as possible to the subject. In the present embodiment, a portion of conductors of the saddle coil 4-1 and a portion of conductors of the coil 7-1 whose sensitivity distribution becomes an odd function in the z-direction are arranged in a total of four places between the subject's eyes. A desirable layout of these conductor regions for keeping the subject's field of view clear is such that as shown in FIGS. 21A and 22A, the conductors 7-1-1-1 to 7-1-4-1 constituting the coil 7-1 are arranged outside the conductors 4-1-1-1 to 4-1-4-1 constituting the sub-coil 4-1. More specifically, a conductor region constituting the sub-coil 4-1 and disposed on a plane parallel to a y-z plane is installed close to the subject, compared with a conductor region constituting the sub-coil 7-1 and disposed on the same plane parallel to the y-z plane. These coil conductors can each be either a general-purpose pole-shaped conductor measuring about 3 to 7 mm in diameter, or a general-purpose plate-shaped conductor measuring several tens of microns in thickness and about 5 to 15 mm in width. However, plate-shaped conductors of the latter type are preferably used in terms of ease in mounting. Since the distance between a person's eyes usually ranges from about 20 to 25 mm, if, as shown in FIG. 22B, four plate-shaped conductors with a width of 7 mm are arranged next to one another in the x-direction between the eyes, these conductors usually cannot skirt the eyes. Even if these plate-shaped conductors are used, however, arranging the conductors in overlapped form in the distance direction with respect to the subject keeps a front region of the subject's eyes clear of the conductor regions and makes it possible to ensure a field of view for the subject.

It may be possible to overlap these coil conductors upon one another in a form reverse to that shown in FIG. 22A (i.e., so that the sub-coils 4-1 and 7-1 are disposed outside and inside, respectively), but the layout shown in FIG. 22A is preferable for the reasons below. The saddle coil 4-1 increases in sensitivity with decreases in the coil size (current loop size). Therefore, the coil is desirably disposed as close as possible to the subject. However, as described in the first embodiment, reducing the size of the sub-coil 7-1 whose sensitivity distribution becomes an odd function in the z-direction does not necessarily work advantageously in the improvement of sensitivity. Peak sensitivity of the coil 7-1 is maximized when a distance between the conductor 7-1-1-1 at the front region of the subject and the conductor 7-1-3-1 at a rear region of the subject is optimized. This distance is longer than a distance between the conductor of the saddle coil 4-1, disposed at the front region of the subject, and the conductor of the saddle coil 4-1, disposed at the rear region of the subject. Therefore, the conductors constituting the saddle coil 4-1 are disposed inside, and the conductors constituting the sub-coil 7-1 are disposed outside. This layout maximizes the peak sensitivities of both coils, hence improving the G-factors thereof.

In this way, according to the present embodiment, it is possible to reduce a feeling of fear in a subject having a head coil mounted over the subject's head, as well as to broaden the subject's field of view, by adopting a coil configuration characterized in that: (1) in a receiving coil constructed of multiple sub-coils, at least a section opposed to a front region of the subject and forming a part of a cover for shrouding the receiving coil is constructed of a light-transmissive material, (2) the coil conductor region 20-2 shrouded with the light-transmissive cover 20-1 is plated with aluminum, and (3) the coil conductor region 20-2 is disposed so as not to obstruct the subject's field of view, and more particularly, a conductor region of a saddle coil 4-1 parallel to a y-direction and a conductor region of a sub-coil 7-1 parallel to the y-direction are arranged in overlapped form so that the saddle coil 4-1 and the sub-coil 7-1 are positioned inside and outside, respectively.

In the second embodiment, not all of the configurational characteristics described above as items (1) to (3) need to be provided, and these characteristics can be combined as appropriate. This configuration can also be changed or modified as appropriate.

Figure 23:
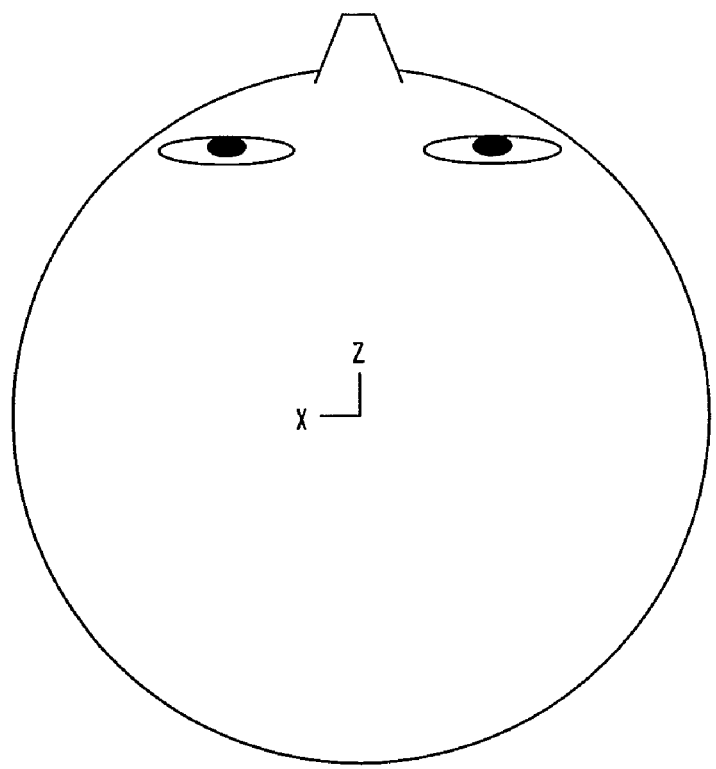
FIG. 23 is a diagram showing a modification of the receiving coil of FIG. 20.

A modification of the second embodiment is shown in FIG. 23. In the present modification, the conductors constituting the sub-coils 4-1 and 7-1 are plate-shaped conductors. In addition, among all these conductors, only the conductor regions 4-1-1-1, 4-1-2-1, 7-1-1-1, and 7-1-2-1, positioned in front of eyes, have respective planes disposed in parallel to the z-direction, and conductors of the coil 7-1 are disposed outside conductors of the coil 4-1. Such a layout of the conductors is effective for further spreading the subject's field of view and thus for relieving the subject's mental oppression.

Figure 24:
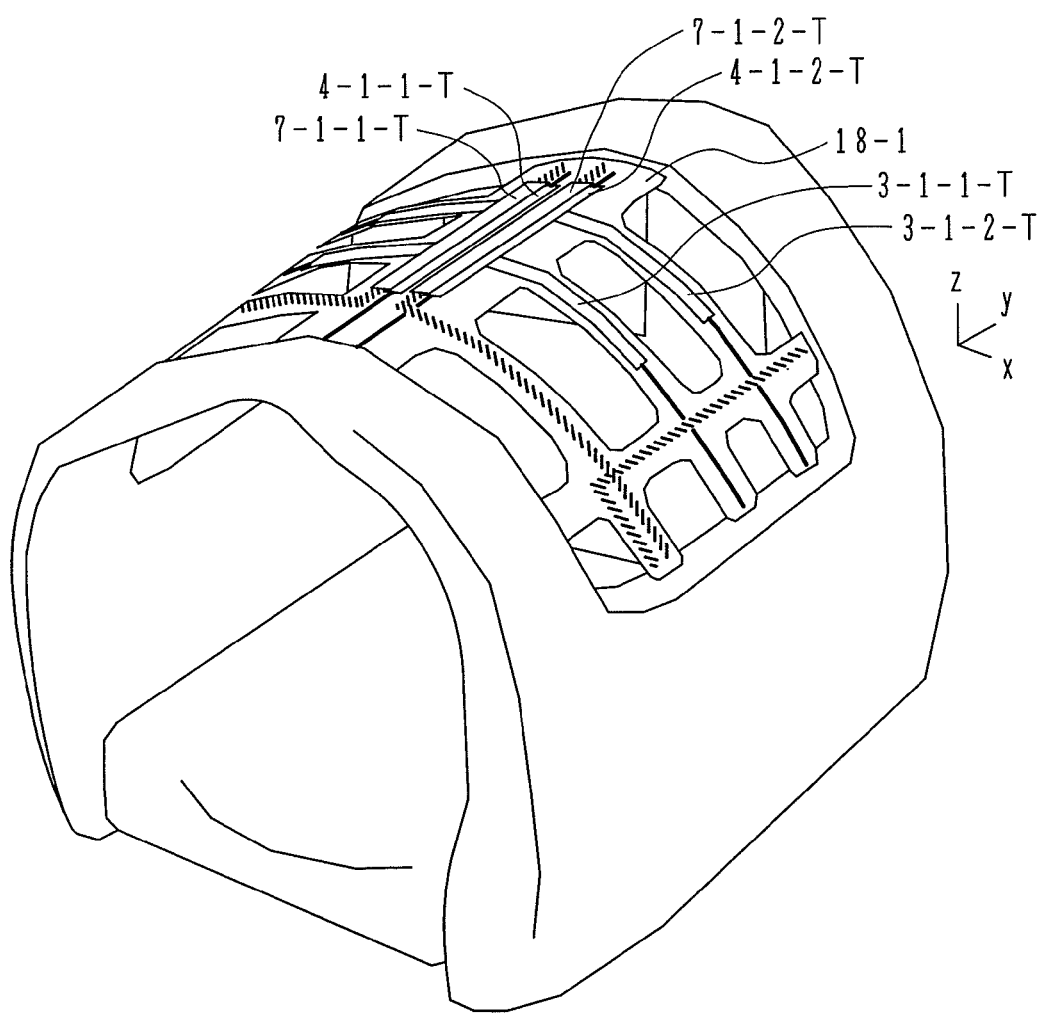
FIG. 24 is a diagram showing another modification of the receiving coil of FIG. 20.

Another modification of the second embodiment is shown in FIG. 24. In the present modification, of all coil conductor regions protected with a cover 20-1 having a light-transmitting property, only those conductor regions 3-1-1-T, 3-1-2-T, 4-1-1-T, 4-1-2-T, 7-1-1-T, and 7-1-2-T that are adjacent to the subject's eyes are each constructed using a transparent electrode represented by indium tin oxide or the like. The other coil conductor regions protected with the cover 20-1 having a light-transmitting property are aluminum-plated copper plates.

Figure 25A:
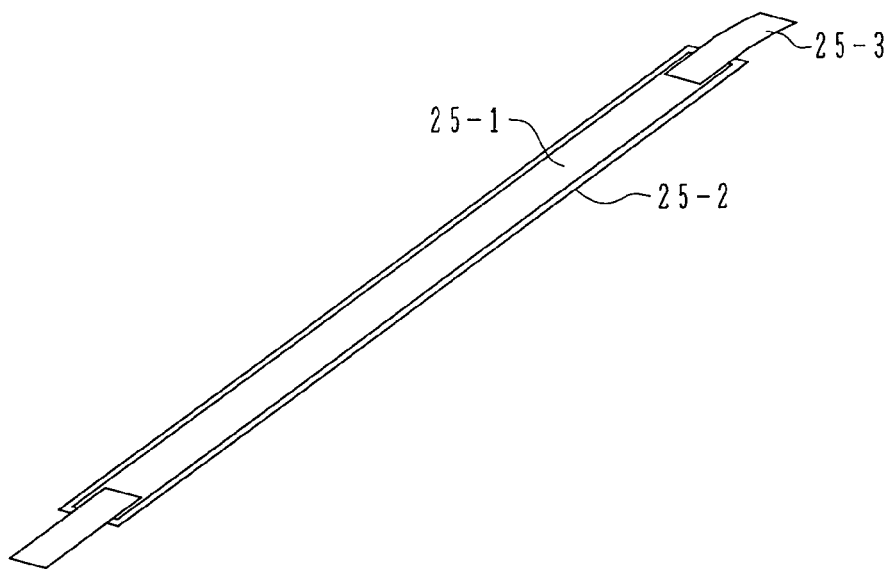
FIG. 25A is a diagram showing an example of a transparent electrode used for the receiving coil of FIG. 24.
Figure 25B:
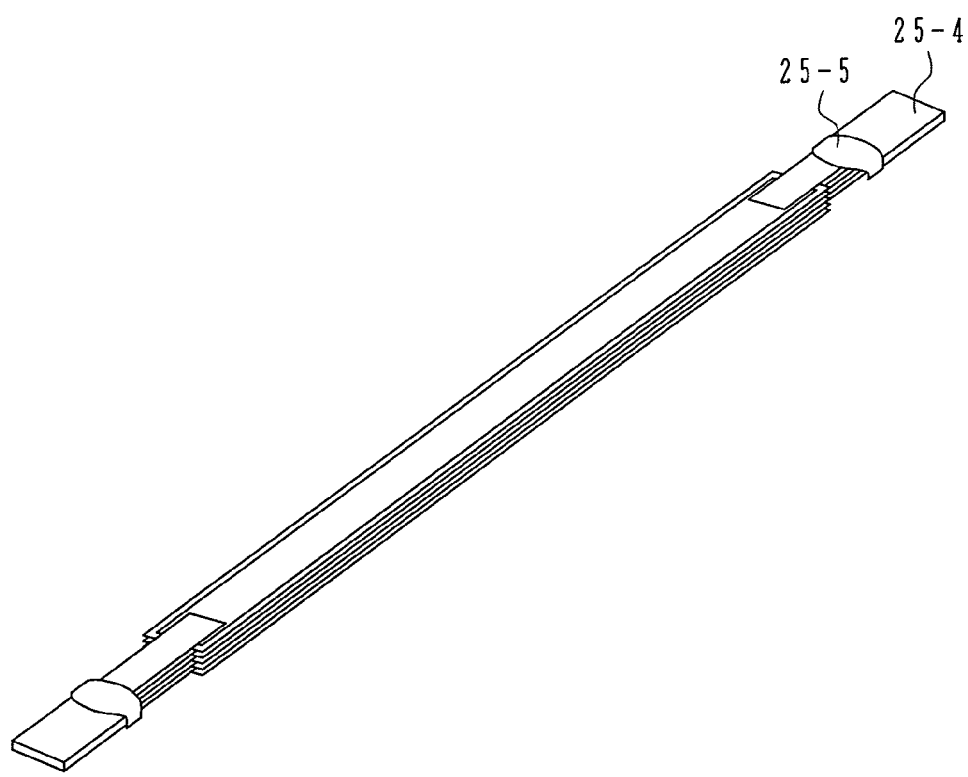
FIG. 25B is a diagram showing another example of the transparent electrode used for the receiving coil of FIG. 24.

Examples of a conductor using a thin indium-tin-oxide film(s) in a portion thereof are shown in FIGS. 25A and 25B. For the conductor shown in FIG. 25A, an end of a thin indium-tin-oxide film 25-1 formed on a thin transparent resin 25-2 is connected to copper foil 25-3. The conductor shown in FIG. 25B is a laminate of thin indium-tin-oxide films for equivalently increasing thickness of the thin indium-tin-oxide film. Copper foil connected to ends of the multiple thin indium-tin-oxide films is connected to a copper plate 25-4 via solder 25-5. It is generally difficult to make the thin indium-tin-oxide film 25-1 thicker than several hundreds of nanometers (nm), but lamination allows the thickness of the thin indium-tin-oxide film to be increased equivalently. This, in turn, reduces conductor loss and improves coil sensitivity.

As described earlier herein, a coil in which all coil conductor regions protected by a light-transmissive cover are constructed using a transparent electrode is disclosed in Patent Document 3. In terms of electroconductivity, however, thin indium-tin-oxide film materials and other materials having a light-transmitting property and electrical conductivity together are at least one order of magnitude lower than the copper currently most commonly used in receiving-coil conductor regions. If an upper conductor region of the receiving coil is constructed using a thin indium-tin-oxide film material or any other material having a light-transmitting property and electrical conductivity together, sensitivity of the receiving coil is likely to decrease significantly. In the present modification of the receiving coil according to the present invention, therefore, such likely conductor loss in the entire coil can be reduced by adopting the coil construction that applies a transparent electrode only to that conductor section adjacent to the subject's eyes that is most influential upon the broadening of the subject's visual field. More specifically, the transparent electrode is 5 to 10 cm long. This broadens the subject's field of view and reduces the conductor loss. In addition, the thus-constructed coil improves the sensitivity of the coil significantly, compared with the coil constructed by applying a transparent electrode to all coil conductor regions protected by a light-transmissive cover.

Yet another modification of the second embodiment is described below. In the present modification, use of a cover 20-1 constructed of a material having a light-transmitting property is limited to a range ergonomically derived.

Figure 26:
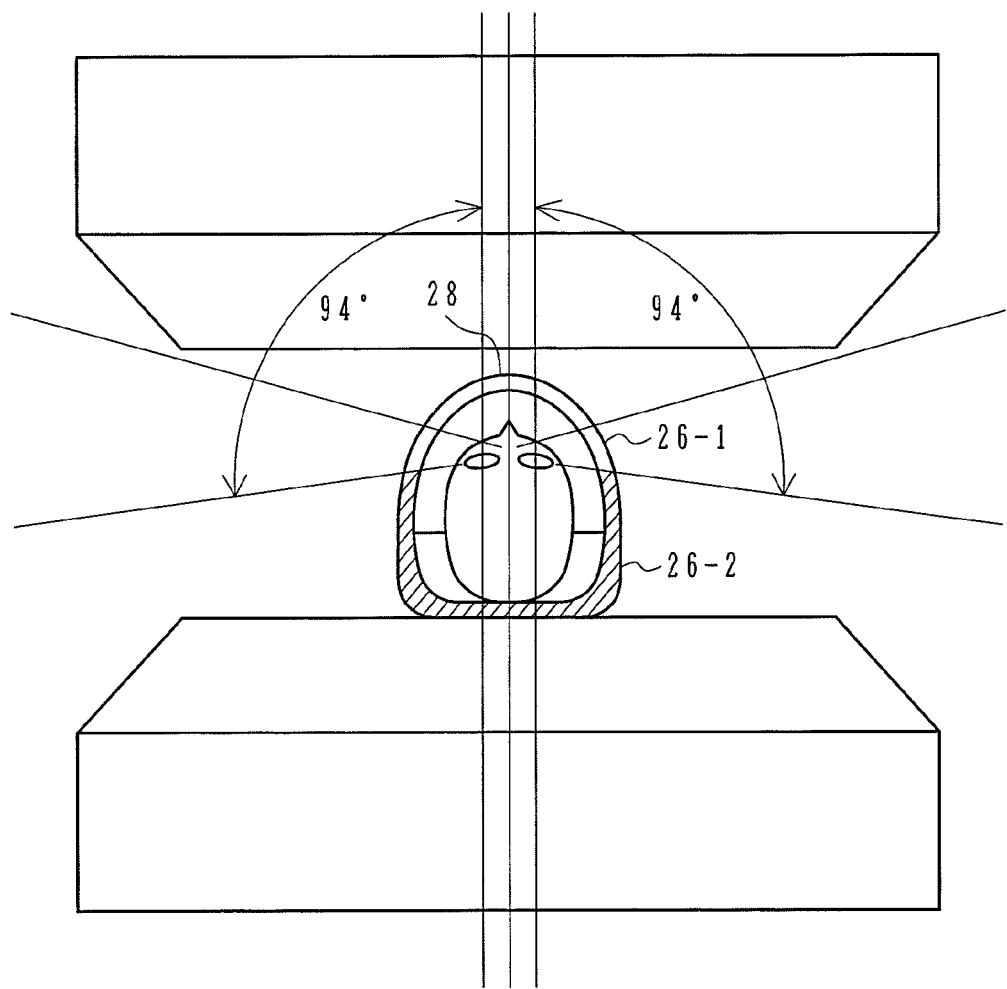
FIG. 26 is a diagram showing yet another modification of the receiving coil of FIG. 20.

FIG. 26 shows a range in which the subject placed in a measuring space formed between a magnet-containing ceiling of the MR imaging apparatus and a magnet-containing gantry thereof can sense light while having the receiving coil mounted around his or her head for examination. Ergonomically, human visual characteristics are such that the human's viewing angle range including a central field and a peripheral field is 188 degrees binocularly and 156 degrees monocularly. In addition, an angle range in which light can be sensed monocularly from a central position of the person's face is 94 degrees, according to, for example, a reference by Niels Diffrient et al., entitled "Human scale 4/5/6," Henry Dreyfuss Associates, pp. 5 (1981).

In the head-imaging RF receiving coil shown in FIG. 26, therefore, use of an essentially transparent section 26-1 (non-shaded section in the figure) is limited to the 94-degree angle range in which one eye can sense light, and other sections including a shaded section 26-2 are essentially opaque. The transparent section 26-1 is constructed of a transparent electrode represented by indium tin oxide and of a cover having a light-transmitting property. More precisely, when an adult subject's head is placed in the receiving coil for examination of the head, the section 26-1 is disposed at an angle position which, on a plane substantially vertical to a major-axis direction of the receiving coil (i.e., on a plane vertical to a body-axis direction of the subject), ranges from 0 degrees to 94 degrees in an outward direction of the MR imaging apparatus with the static magnetic field direction thereof taken as an axis, with a substantially central point of the subject's pupil taken as a center, and with an upward position of the subject as a starting point.

Since the use of the essentially transparent section 26-1 is limited to a particular region in this way, an application region of the transparent electrode formed of a material having a light-transmitting property and an electrically conductive property together yet featuring low electroconductivity is limited, which leads to significantly improved sensitivity of the coil and at the same time allows the subject's feeling of fear in the measuring space to be significantly reduced by making the subject fully aware of the light. The angle range from 0 degrees to 94 degrees applies to monocular sensing of light. As a whole, the angle range is made up of a right-side section within 94 degrees from an upward position of the right eye and of a left-side section within 94 degrees from an upward position of the left eye. A region 28 above the subject surrounded by the regions lying above each eye in the above angle range can be either a substantially transparent region or a substantially opaque region. If the region 28 is formed as a substantially transparent region, the subject's fear and oppression can be further reduced. If the region 28 is formed as a substantially opaque region, the coil sensitivity can be further enhanced.

As set forth above, according to the present invention, a receiving coil is provided that can be used in vertical magnetic field MRI, has high head-depth sensitivity, and enables high-speed parallel imaging of an arbitrary cross section. The MR imaging apparatus of the present invention and the receiving coil used for the imaging apparatus are not limited to the above-described embodiments and modifications thereof, and for example, one or two other kinds of coils may be added to two kinds of solenoid coils (first sub-coils) and three kinds of odd-function coils (second sub-coils). In that case, the number of kinds of coils increases to achieve a coil arrangement that can improve G-factors.

The invention claimed is:

1. A magnetic resonance imaging apparatus comprising:
    means for generating a static magnetic field in a vertical direction;
    means for generating an excitation RF pulse to be applied to an object placed in the static magnetic field for examination;
    means for generating a gradient magnetic field; and
    a receiving coil constructed of a plurality of sub-coils, the receiving coil being adapted to detect a nuclear magnetic resonance signal generated from the object to be examined;
    wherein the receiving coil includes, as the plurality of sub-coils:
    a first sub-coil formed of one or a plurality of solenoid coils to detect a magnetic field generated in a crossing direction with respect to the direction of the static magnetic field; and
    a second sub-coil whose sensitivity distribution has an origin on a central axis of the solenoid coil and becomes an odd function in the direction of the static magnetic field.

2. The magnetic resonance imaging apparatus according to claim 1 wherein:
    the second sub-coil has four current loops, each of the current loops being disposed so as to surround the object to be examined.

3. The magnetic resonance imaging apparatus according to claim 1 or 2 wherein:
    the first sub-coil includes a first solenoid coil and a second solenoid coil, the first solenoid coil and the second solenoid coil having respective loops arranged substantially orthogonal to each other.

4. The magnetic resonance imaging apparatus according to claim 1 or 2 wherein:
    the receiving coil includes as a sub-coil a third sub-coil whose sensitivity distribution having an origin on a central axis of the solenoid coil becomes an odd function in a first direction orthogonal to the direction of the static magnetic field.

5. The magnetic resonance imaging apparatus according to claim 1 or 2 wherein:
    the receiving coil includes, as sub-coils:
    a third sub-coil whose sensitivity distribution has an origin on a central axis of the solenoid coil and becomes an odd function in a first direction orthogonal to the direction of the static magnetic field; and
    a fourth sub-coil whose sensitivity distribution has an origin on the central axis of the solenoid coil and becomes an odd function in a second direction orthogonal to the direction of the static magnetic field and the first direction.

6. The magnetic resonance imaging apparatus according to claim 5 wherein:
    the third sub-coil and the fourth sub-coil each have three current loops, the current loops located centrally in each sub-coil being arranged so as to overlap each other with a required overlapping area, and the required overlapping area being adjusted to remove electromagnetic coupling between the third sub-coil and the fourth sub-coil.

7. A magnetic resonance imaging apparatus comprising:
means for generating a static magnetic field in a vertical direction;
means for generating an excitation RF pulse to be applied to an object placed in the static magnetic field for examination;
means for generating a gradient magnetic field; and
a receiving coil constructed of a plurality of sub-coils, the receiving coil being adapted to detect a nuclear magnetic resonance signal generated from the object to be examined;
wherein:
the receiving coil includes, as the plurality of sub-coils,
a first sub-coil having a plurality of current loops, the first sub-coil being formed of a solenoid coil which detects a magnetic field generated in a crossing direction with respect to the direction of the static magnetic field, and
a second sub-coil having a plurality of current loops, the second sub-coil being formed such that a sensitivity distribution thereof has an origin on a central axis of the solenoid coil and becomes an odd function in the direction of the static magnetic field;
the first sub-coil and the second sub-coil each have a conductor region routed through a plane essentially parallel to a first plane of the object to be examined, the conductor regions themselves of the first and second sub-coils also being parallel to each other; and
both of the conductor regions being arranged to overlap each other at a position in a distance direction between the coil and the object to be examined.

8. The magnetic resonance imaging apparatus according to claim 7 wherein:
the object to be examined is a human head, the first plane of the examination object being a human face.

9. The magnetic resonance imaging apparatus according to claim 7 or 8 wherein:
the conductor region of the first sub-coil is disposed closer to the examination object than the conductor region of the second sub-coil.

10. The magnetic resonance imaging apparatus according to claim 7 or 8 wherein:
at least a part of the conductor regions of the first and second sub-coils is a plate-shaped conductor, the plate-shaped conductor forming a plane essentially parallel to the direction of the static magnetic field.

11. The magnetic resonance imaging apparatus according to claim 7 or 8 wherein:
the conductor region of the first sub-coil and the conductor region of the second sub-coil include at least a portion formed of a light-transmissive electroconductive material and covered with a light-transmissive resin.

12. The magnetic resonance imaging apparatus according to claim 11 wherein:
the portion covered with the light-transmissive resin is formed such that, on a plane including a central axis of the solenoid coil and parallel to the direction of the static magnetic field, when a line parallel to the direction of the static magnetic field that extends toward an upper area above the person's face from a substantial central point of the person's pupil is taken as an axis, the portion covered with the resin forms an angle equal to or less than 94 degrees, between a line connecting the central point and an end of the resin-covered portion and the axis.

13. The magnetic resonance imaging apparatus according to claim 7 or 8 wherein:
the receiving means includes, as a sub-coil, a solenoid coil with a conductor region in a direction orthogonal to the conductor region of the first sub-coil and to the conductor region of the second sub-coil.

14. The magnetic resonance imaging apparatus according to claim 7 or 8 wherein:
the receiving means includes, as sub-coils, one or a plurality of sub-coils whose sensitivity distributions each become an odd function in a direction orthogonal to the direction of the static magnetic field.

15. An RF coil for a magnetic resonance imaging apparatus, comprising a plurality of sub-coils, wherein the RF coil includes:
a first solenoid coil;
a second solenoid coil disposed in a form essentially orthogonal to the first coil; and
third, fourth, and fifth sub-coils whose sensitivity distributions each have an origin on a central axis of either the first or second solenoid coil and become an odd function in any one of three directions orthogonal to one another.

16. The magnetic resonance imaging apparatus RF coil according to claim 15 wherein:
the third sub-coil and the fourth sub-coil each have three current loops, the current loops located centrally in each sub-coil being arranged so as to overlap each other with a required overlapping area and the required overlapping area being adjusted to remove electromagnetic coupling between the third sub-coil and the fourth sub-coil.

17. An RF coil for a head, having a plurality of sub-coils, the RF coil further comprising:
a first sub-coil including a solenoid coil which has a plurality of current loops; and
a second sub-coil which has a plurality of current loops and whose sensitivity distribution becomes an odd function with a central axis of the solenoid coil as an origin;
wherein:
the first sub-coil and the second sub-coil each have a conductor region passing through a plane essentially parallel to a subject's face, the conductor regions themselves of both sub-coils also being parallel to each other, and the conductor region of the first sub-coil is disposed at a position closer to the subject's face than the conductor region of the second sub-coil.

18. The RF coil according to claim 17 wherein:
at least a part of the conductor regions of the first and second sub-coils is a plate-shaped conductor, the plate-shaped conductor forming a plane essentially orthogonal to the subject's face.

19. The RF coil according to claim 17 or 18 wherein:
the conductor region of the first sub-coil and the conductor region of the second sub-coil include at least a portion formed of a light-transmissive electroconductive material and covered with a light-transmissive resin.

20. The RF coil according to claim 19 wherein:
at least a part of the conductor regions of the first and second sub-coils is a thin indium-tin-oxide film formed on the light-transmissive resin.

21. The RF coil according to claim 20 wherein:
the thin indium-tin-oxide film is a multilayered film.

22. The RF coil according to claim 19 wherein:
the portion covered with the light-transmissive resin is such that, on a plane substantially vertical to the subject's face and including a line to connect the subject's pupils, when an axis heading in an upward direction of the face from a substantially central point of one pupil of the subject is taken as a starting point, the axis and a line connecting the central point and an end of the portion covered with the light-transmissive resin form an angle equal to or less than 94 degrees.

* * * * *